US007934852B2

(12) United States Patent
Allen et al.

(10) Patent No.: US 7,934,852 B2
(45) Date of Patent: *May 3, 2011

(54) JACKETED LED ASSEMBLIES AND LIGHT STRINGS CONTAINING SAME

(75) Inventors: Mark R. Allen, Encinitas, CA (US); David Allen, Yardley, PA (US)

(73) Assignee: Fiber Optic Designs, Inc., Yardley, PA (US)

( * ) Notice: Subject to any disclaimer, the term of this patent is extended or adjusted under 35 U.S.C. 154(b) by 327 days.

This patent is subject to a terminal disclaimer.

(21) Appl. No.: 11/785,434

(22) Filed: Apr. 17, 2007
(Under 37 CFR 1.47)

(65) Prior Publication Data
US 2007/0263387 A1 Nov. 15, 2007

Related U.S. Application Data

(63) Continuation of application No. 11/357,405, filed on Feb. 21, 2006, now Pat. No. 7,220,022, which is a continuation of application No. 10/755,463, filed on Jan. 13, 2004, now Pat. No. 7,066,628, which is a continuation-in-part of application No. 10/243,835, filed on Sep. 16, 2002, now Pat. No. 6,830,358, which is a continuation of application No. 09/819,736, filed on Mar. 29, 2001, now Pat. No. 6,461,019, which is a continuation-in-part of application No. 09/378,631, filed on Aug. 20, 1999, now abandoned, which is a continuation-in-part of application No. 09/339,616, filed on Jun. 24, 1999, now abandoned.

(60) Provisional application No. 60/119,804, filed on Feb. 12, 1999.

(51) Int. Cl.
*F21S 4/00* (2006.01)

(52) U.S. Cl. .................. 362/249.02; 362/255; 362/267; 362/363; 362/800; 257/98

(58) Field of Classification Search .................. 362/255, 362/256, 257, 311, 363, 800, 645, 249.02; 257/98, 99
See application file for complete search history.

(56) References Cited

U.S. PATENT DOCUMENTS

| | | | |
|---|---|---|---|
| 4,675,575 A | 6/1987 | Smith et al. | |
| 4,924,362 A | 5/1990 | Janko et al. | |
| 6,413,461 B1 | 7/2002 | Kobayashi et al. | |
| 6,416,203 B1 | 7/2002 | Wong | |
| 6,485,595 B1 | 11/2002 | Yenni et al. | |
| 6,830,358 B2 | 12/2004 | Allen | |
| 7,066,628 B2 * | 6/2006 | Allen | 362/267 |
| 7,220,022 B2 * | 5/2007 | Allen et al. | 362/267 |

OTHER PUBLICATIONS

Non-Final Office Action of Sep. 4, 2009 for 95/000,425.
Rule 132 Declaration filed Dec. 2, 2009 for 95/000,425.
Response to Notice Re Defective Paper in Inter Partes Reexamination filed Jan. 15, 2010 for 95/000,425.
Third Party Requestor's Comments after Non-Final Office Action filed Feb. 9, 2010.

* cited by examiner

*Primary Examiner* — Stephen F Husar
(74) *Attorney, Agent, or Firm* — Berenato & White, LLC

(57) ABSTRACT

A jacketed light emitting diode assembly is provided, which includes a light emitting diode including a set of positive and negative contacts, and a lens body containing a semiconductor chip and end portions of the contacts. An electrical wire set of first and second electrical wires are connected to the positive contact and the negative contact, respectively. A light transmissive cover receives the lens body, and has an opening through which at least one of the contact set and the electrical wire set passes. An integrally molded plastic jacket at the opening of the light transmissive cover provides a seal at the opening against moisture and airborne contaminants. A waterproof light string including one or more of the jacketed light emitting diode assemblies is also provided, as are related methods.

21 Claims, 15 Drawing Sheets

JACKETED LED ASSEMBLIES AND LIGHT STRINGS CONTAINING SAME

This application is a continuation of U.S. patent application Ser. No. 11/357,405 filed Feb. 21, 2006, now U.S. Pat. No. 7,220,022 which is a continuation of U.S. patent application Ser. No. 10/755,463 filed Jan. 13, 2004, now U.S. Pat. No. 7,066,628 which was a continuation-in-part of patent application Ser. No. 10/243,835 filed Sep. 16, 2002, now U.S. Pat. No. 6,830,358 which is a continuation of patent application Ser. No. 09/819,736 filed Mar. 29, 2001, now U.S. Pat. No. 6,461,019 which is a continuation-in-part of patent application Ser. No. 09/378,631 filed Aug. 20, 1999, now abandoned which is a continuation-in-part of patent application Ser. No. 09/339,616 filed Jun. 24, 1999 now abandoned. This application claims benefit of U.S. Provisional Application No. 60/119,804, filed Feb. 12, 1999. The disclosures of the aforementioned applications are incorporated herein by reference, and the domestic benefit of the aforementioned applications are hereby claimed under 35 U.S.C. §§119 and 120.

BACKGROUND OF THE INVENTION

1. Field of Invention

The present invention relates to light emitting diode assemblies, light strings comprising a plurality of light emitting diode assemblies, and related methods.

2. Description of Related Art

Light emitting diodes (LEDs) are increasingly employed as a basic lighting source in a variety of forms, including decorative lighting, for reasons among the following. First, as part of an assembly, LEDs have a very long lifespan, compared with common incandescent and fluorescent sources. For example, a typical LED lifespan is at least 100,000 hours. Second, LEDs have several favorable physical properties, including ruggedness, cool operation, and ability to operate under wide temperature variations. Third, LEDs are currently available in all primary and several secondary colors, as well as in a "white" form employing a blue source and phosphors. Fourth, with newer doping techniques, LEDs are becoming increasingly efficient, and colored LED sources currently available may consume an order of magnitude less power than incandescent bulbs of equivalent light output. Moreover, with expanding applications and resulting larger volume demand, as well as with new manufacturing techniques, LEDs are increasingly cost effective.

Conventional LEDs are typically constructed using steel or coated steal contacts or frames. LED contacts are also available in copper or copper-alloys, although these materials generally are considered undesirable because of their higher cost and incompatibility with some automated LED manufacturing equipment and certain types of LED die material.

LED-containing holiday and decorative light sets, such as used for decorative purposes such as for Christmas lighting, typically use copper-alloy contacts to transfer electricity from the lead wires to the LED lamps. Although manufacturers take efforts to seal the contacts and connections against moisture and airborne contaminants, it is difficult if not impossible to achieve completely and consistently a moisture and contaminant seal.

LED-based light strings also present other drawbacks. For example, U.S. Pat. No. 5,495,147 entitled LED LIGHT STRING SYSTEM to Lanzisera ("Lanzisera") and U.S. Pat. No. 4,984,999 entitled STRING OF LIGHTS SPECIFICATION to Leake ("Leake") describe different forms of LED-based light strings. In both Lanzisera and Leake, exemplary light strings are described employing purely parallel wiring of discrete LED lamps using a step-down transformer and rectifier power conversion scheme. These and all other LED light string descriptions found in the prior art convert input electrical power, usually assumed to be the common U.S. household power of 110 VAC to a low voltage, nearly DC input.

SUMMARY OF THE INVENTION

It is an object of this invention to provide an LED assembly capable of addressing one or more of the above-mentioned drawbacks.

It is another object of this invention to provide an LED assembly possessing a complete and permanent barrier, especially for the metal contacts and associated electrical connections, against moisture and corrosive contaminants.

It is still another object of this invention to provide an LED assembly having improved durability and longevity.

It is another object of the invention to provide a light string comprising a series of LED assemblies of the invention.

It is still another object of the invention to provide a method for manufacturing the assemblies and light-strings of this invention.

To achieve one or more of the foregoing objects, and in accordance with the purposes of the invention as embodied and broadly described in this document, according to a first aspect of this invention there is provided a jacketed light emitting diode assembly, comprising a light emitting diode, an electrical wire set, a light transmissive cover, and an integrally molded plastic jacket. The light emitting diode comprises a contact set comprising a positive contact and a negative contact, each of the contacts having a first end portion and a second end portion, and a lens body containing a semiconductor chip and the first end portions of the positive and negative contacts. The electrical wire set comprises a first electrical wire and a second electrical wire electrically connected to the second end portions of the positive contact and the negative contact, respectively. The light transmissive cover has a cavity receiving the lens body, and an opening having at least one of the contact set and the electrical wire set passing therethrough. The integrally molded plastic jacket is positioned at the opening of the light transmissive cover to provide a seal at the opening against moisture and airborne contaminants.

According to a second aspect of the invention a method is provided for making a jacketed light emitting diode assembly. The method comprises providing a light emitting diode comprising a positive contact and a negative contact of a contact set, each of the contacts having a first end portion and a second end portion, and a lens body containing a semiconductor chip and the first end portions of the positive and negative contacts. A first electrical wire and a second electrical wire of an electrical wire set are electrically connected to the second end portions of the positive contact and the negative contact, respectively. The light emitting diode is inserted through an opening and into a cavity of a light transmissive cover, so that the contact set and/or the electrical wire set passes through the opening. A plastic jacket is molded integrally at the opening of the light transmissive cover to provide a seal at the opening against moisture and airborne contaminants.

A third aspect of the invention provides a light string comprising a plurality of light emitting diode assemblies connected to one another, the light emitting diode assemblies comprising a plurality of jacketed light emitting diode assemblies, comprising a light emitting diode, an electrical wire set, a light transmissive cover, and an integrally molded plastic jacket. The contact set comprises a positive contact and a negative contact, each of the contacts having a first end portion and a second end portion, and a lens body containing a semiconductor chip and the first end portions of the positive and negative contacts. The electrical wire set comprises a first electrical wire and a second electrical wire electrically connected to the second end portions of the positive contact and the negative contact, respectively. The light transmissive cover has a cavity with an opening, the cavity receiving the lens body, the opening having the contact set and/or the electrical wire set passing therethrough. The integrally molded plastic jacket, which is at the opening of the light transmissive cover, provides a seal at the opening against moisture and airborne contaminants along a length of the light string.

In accordance with a fourth embodiment of the invention, a method is provided for moisture sealing a light-emitting diode elements of a light string. The method comprises providing a light string comprising a plurality of light emitting diodes, the plurality of light emitting diodes comprising a positive contact and a negative contact of a contact set, each of the contacts having a first end portion and a second end portion, and a lens body containing a semiconductor chip and the first end portions of the positive and negative contacts. First and second electrical wires of an electrical wire set are electrically connected to the second end portions of the positive contact and the negative contact, respectively. The light emitting diode is inserted through an opening and into a cavity of a light transmissive cover, the opening having at least one of the contact set and the electrical wire set passing therethrough. A plastic jacket is molded integrally at the opening of the light transmissive cover to provide a seal at the opening against moisture and airborne contaminants.

BRIEF DESCRIPTION OF THE DRAWINGS

The accompanying drawings are incorporated in and constitute a part of the specification. The drawings, together with the general description given above and the detailed description of the certain preferred embodiments and methods given below, serve to explain the principles of the invention. In such drawings.

Figure 1A:
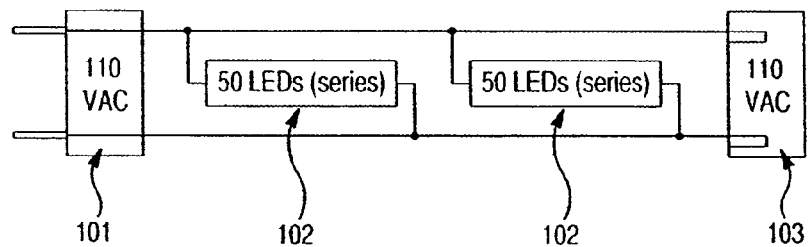
FIGS. 1A and 1B show two example block diagrams of the light string in its embodiment preferred primarily, with one diagram for a 110 VAC common household input electrical source (e.g., 60 Hz) and one diagram for a 220 VAC common household (e.g., 50 Hz) input electrical source.

DETAILED DESCRIPTION OF CERTAIN PREFERRED EMBODIMENTS AND CERTAIN PREFERRED METHODS OF THE INVENTION

Reference will now be made in detail to the presently preferred embodiments and methods of the invention as illustrated in the accompanying drawings, in which like reference characters designate like or corresponding parts throughout the drawings. It should be noted, however, that the invention in its broader aspects is not limited to the specific details, representative assemblies and methods, and illustrative examples shown and described in this section in connection with the preferred embodiments and methods. The invention according to its various aspects is particularly pointed out and distinctly claimed in the attached claims read in view of this specification, and appropriate equivalents.

It is to be noted that, as used in the specification and the appended claims, the singular forms "a," "an," and "the" include plural referents unless the context clearly dictates otherwise.

According to an embodiment of the present invention, a jacketed light emitting diode assembly is provided, comprising a light emitting diode, an electrical wire set, a light transmissive cover, and an integrally molded plastic jacket. The light emitting diode comprises a contact set comprising a positive contact and a negative contact, each of the contacts having a first end portion and a second end portion, and a lens body containing a semiconductor chip and the first end portions of the positive and negative contacts. The electrical wire set comprises a first electrical wire and a second electrical wire electrically connected to the second end portions of the positive contact and the negative contact, respectively. The light transmissive cover has a cavity receiving the lens body, and an opening through which the contact set and/or the electrical wire set passes. The integrally molded plastic jacket is provided at the opening of the light transparent cover to provide a seal at the opening against moisture and airborne contaminants. The internal circuitry of the light emitting diode assembly may include internal resistance elements as known by those of skill in the art.

Figure 14:
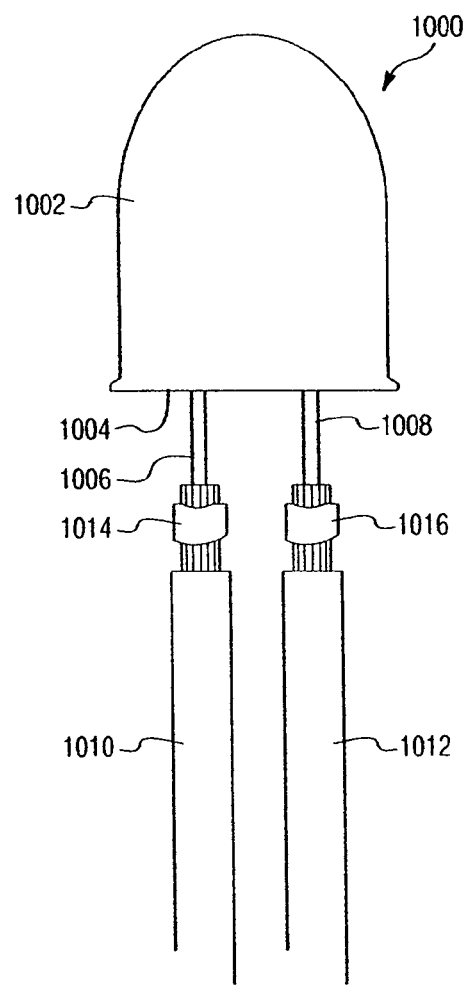
FIG. 14 shows an unjacketed LED assembly having crimp connectors.
Figure 17:
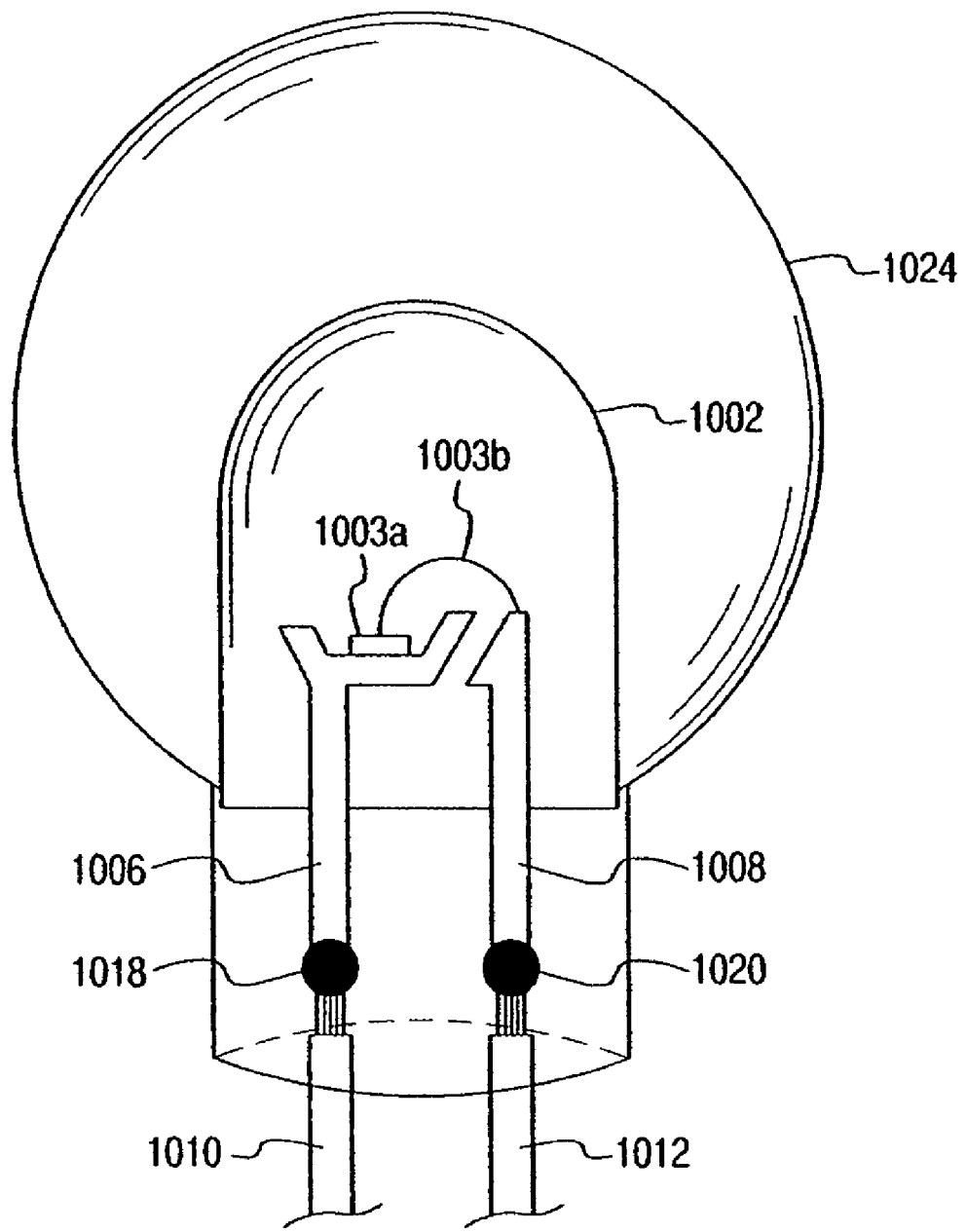
FIG. 17 shows an unjacketed LED assembly inserted into a light-transmissive cover.
Figure 18:
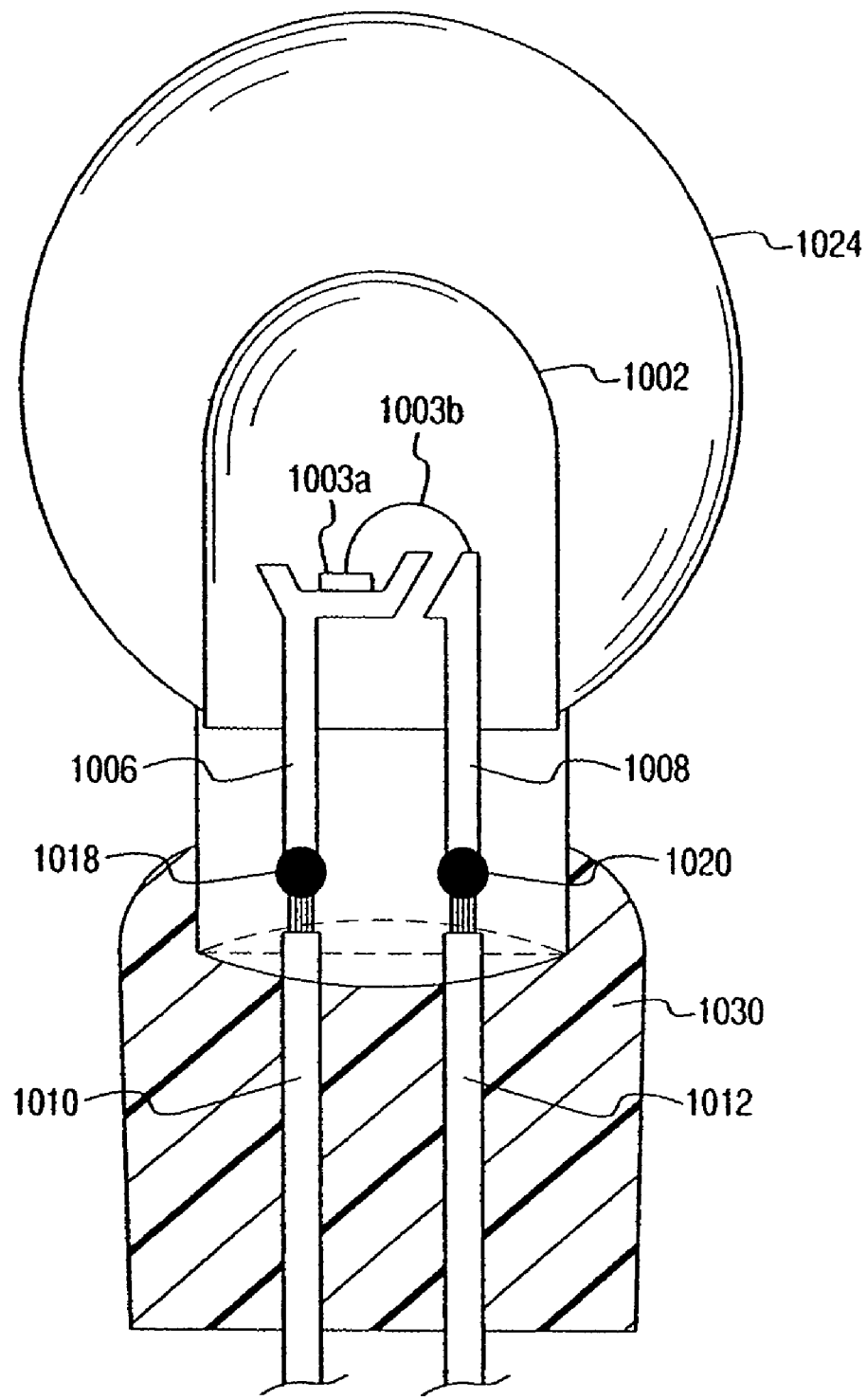
FIG. 18 shows a partially sectioned view of a jacketed LED assembly according to an embodiment of the invention.
Figure 19:
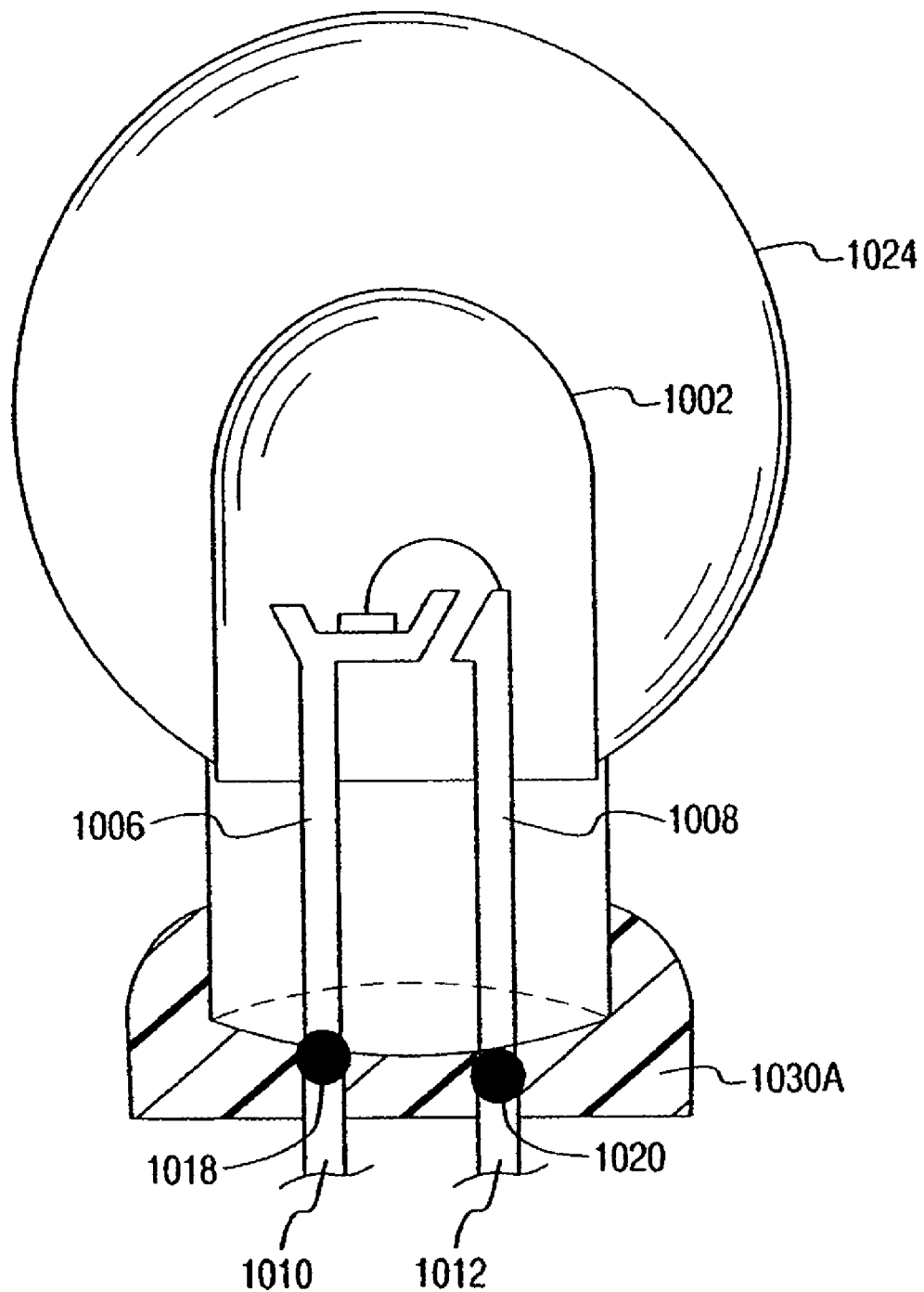
FIG. 19 shows a partially sectioned view of a jacketed LED assembly according to another embodiment of the invention.

An example of a light emitting diode is depicted in FIG. 14 and generally designated by reference numeral 1000. The light emitting diode 1000 comprises an LED lens (also referred to as a lamp) 1002, and contacts 1006, 1008. In the illustrated embodiment, the lamp 1002 is depicted as a dome-shaped member. The lens 1002 may undertake various other shapes, many of which are known and practiced in the art, e.g., oblong, cylindrical, pointed, polygonal. The lens 1002 may be made of various materials, such as glass, plastic, or epoxy and may be clear, clear-colored, and/or diffuse-colored. It should be noted that LED lenses are normally encapsulated in epoxy. Light-emitting elements (e.g., semiconductors, 1003a in FIGS. 17-19) and internal circuitry (e.g., wire 1003b in FIGS. 17-19) are housed in the lens 1002. The conventional LED structure shown in FIGS. 17-19 is for discussion purposes only. It is to be understood that other structures, arrangements, and configurations suitable for use or known in the LED art may be used. These elements and circuitry are well known in the art and, therefore, not described herein in detail. It is noted, however, that the internal circuitry may provide for emission of a continuous light signal, intermittent on-off blinking, and/or intermittent LED sub-die color changes.

A flanged lens base 1004 is optionally formed at an end of the lens 1002, and may form part of a seal of the lens chamber. This lens base 1004 can be formed with a "flange" (as illustrated), or without a flange. Protruding through the lens base 1004 are a contact set comprising a negative contact 1006 and a positive contact 1008 (also referred to in the art as frames or leads) extending parallel to one another. Thus, the contacts 1006 and 1008 have first end portions (unnumbered) contained in the lens 1002, and second end portions (unnumbered) outside of the lens 1002. The contacts 1006 and 1008 are preferably made of a metal or alloy, such as steel, coated steel, copper, or a copper alloy.

Figure 15:
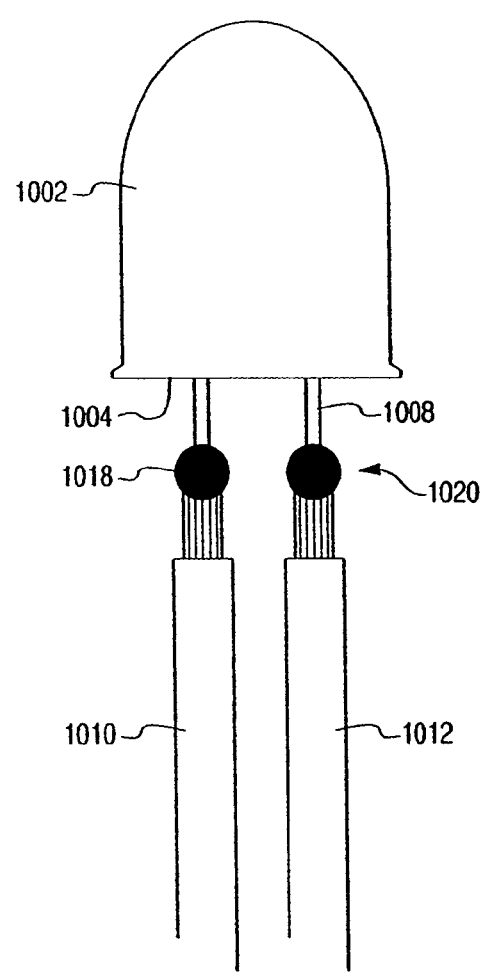
FIG. 15 shows an unjacketed LED assembly having solder connections.

The light emitting diode 1000 is assembled to a set of electrical wires 1010 and 1012, e.g., drive wires, discussed below. Various mechanical and chemical mechanisms and means may be employed for attaching the light emitting diode 1000 to the electrical wires 1010 and 1012. For example, FIG. 14 illustrates conventional crimp connectors 1014 and 1016 for making the respective connections. Another example is shown in FIG. 15, which is substantially identical to the assembly of FIG. 14 but includes solder connections 1018 and 1020 in place of the crimp connectors 1014 and 1016, respectively.

Figure 16:
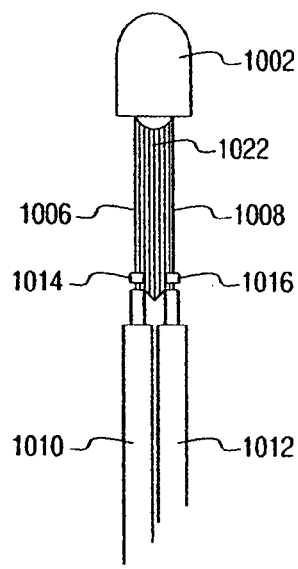
FIG. 16 shows another embodiment of an unjacketed LED assembly containing a contact separator.

As shown in FIG. 16, the light emitting diode assembly may optionally further comprise a contact separator 1022. The contact separator 1022 is placed between the contacts 1006 and 1008 to prevent accidental contact and resultant shorting thereof. The contact separator 1022 is made of a non-conductive material, such as a plastic. Although FIG. 16 illustrates the contact separator 1022 used in combination with the crimp connectors 1014 and 1016, it is to be understood that other connection means, including, for example, solder, may be used.

The LED assembly further comprises a light transmissive cover 1024. As shown in FIGS. 17-20, the light transmissive cover 1024 may have a generally spherical shape with a cylindrical base, although other shapes (e.g., bulb-like, cylindrical, frustum-conical, conical, polygonal, etc.) may be selected. The light-transmissive cover 1024 permits for the full or partial passage of light emitted from the LED 1000. The light transmissive cover 1024 may be made of a transparent material, such as one selected from the group consisting of glass and plastic, such as polycarbonates. The cover 1024 may be optically clear, tainted colored, frosted, semi-transparent or translucent, and the like for providing the desired illumination effect. The light-transmissive cover 1024 may include prisms, facets, or other designs or patterns.

The light emitting diode 1000 is inserted through an opening of the light transmissive cover 1024 base, so that a portion and more preferably all of the LED lens 1002 is situated in the chamber of the light transparent cover 1024. Preferably, the opening of the light transmissive cover 1024 is sized to be relatively tight yet slidable relative to the LED lens base 1004. In this manner, the LED 1000 may be retained in the opening of the light transmissive cover, yet permit for insertion and removal with firm force. Alternatively, a bonding or mechanical securing (e.g., clamping) means may be used to retain the light emitting diode 1000 relative to the light transmissive cover 1024.

In accordance with embodiments of the present invention, a plastic jacket is integrally molded onto the light emitting diode assembly at the opening of the light transparent cover to provide a seal at the opening against moisture and airborne contaminants.

Figure 20:
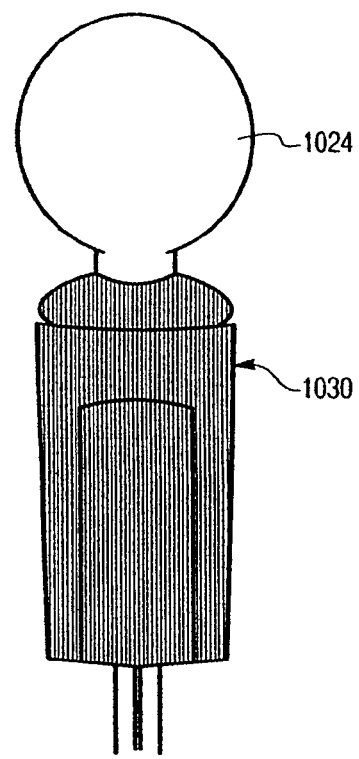
FIG. 20 shows a non-sectioned view of the jacketed LED assembly of FIG. 18 or 19.
Figure 21:
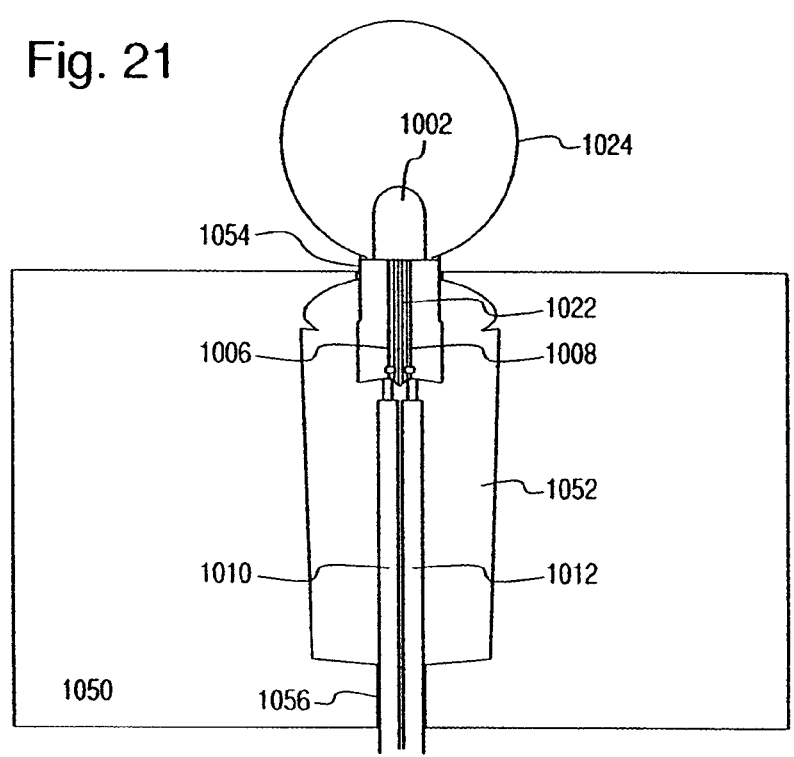
FIG. 21 shows a step involved in the manufacture of a jacketed LED assembly according to another embodiment of the invention.

An embodiment of a plastic jacket is illustrated in FIGS. 18-20 and designated by reference numeral 1030 and 1030A. The jacket 1030, 1030A may comprise one or more plastic materials, used alone or in combination with non-plastics. Preferably but not necessarily, the jacket 1030, 1030A consists of one or more plastic materials. Suitable plastics include, for example and not necessarily limitation, polycarbonate (PC), poly(vinyl chloride) (PVC), polypropylene (PP), and any combination thereof. The plastic material may be optically transparent or non-transparent, clear or colored.

The plastic jacket 1030, 1030A is integrally molded on the base of the light transparent cover 1024 to intimately contact electrical wires 1010 and 1012. The plastic jacket 1030, 1030A preferably yet optionally contacts less than the entire surfaces of the light transmissive cover 1024, e.g., in FIG. 20 jacket 1030 contacts the base of the cover 1024. The plastic jacket 1030, 1030A may enter into the opening of the light transmissive cover 1024, for example, to contact a portion of the interior of the cover 1024 base. It should be understood that the portion of the light transmissive cover 1024 that the plastic jacket 1030, 1030A contacts need not be light transmissive.

In the embodiment illustrated in FIG. 18, the electrical wires 1010 and 1012 pass through the opening of the light transmissive cover 1024, and the plastic jacket 1030 encases (at least) respective regions of the electrical wire set passing through the opening. Another embodiment is illustrated in FIG. 19, in which the first and second contacts 1006 and 1008 pass through the opening of the light transmissive cover 1024. In the embodiment illustrated in FIG. 19, the plastic jacket 1030A encases the contacts 1006 and 1008, the distal end portions of the electrical wires 1010 and 1012, and the second end portions of the corresponding connectors 1014 and 1016. (In the event the connectors 1014 and 1016 pass through at the opening of the cover 1024, the connectors 1014 and 1016 may be considered to be part of the contacts 1006, 1008 or the electrical wires 1010, 1012.)

Although not shown, the plastic jacket 1030 or 1030A may optionally encase other components of the LED 1000, including the lamp base 1004, a greater or lesser portion or all of the contacts 1006, 1008, a greater or lesser portion or all of the cover 1024, as well as a greater or lesser portion of the electrical wires 1010 and 1012.

In preferred embodiments of the invention, the plastic jacket 1030 (or 1030A) provides a permanent, waterproof (or at least moisture resistant), and corrosion resistant encapsulation for at least the contacts 1006 and 1008, the connectors 1014 and 1016, and the distal portion of the electrical wires 1010 and 1012. The invention provides an arrangement where a series of LEDs are interconnected in a sealed, waterproof assembly.

As used herein, "integrally molded" jacket refers to a plastic jacket that has been molded onto, as opposed to pre-molded and subsequently applied to, another member or device, such as a light transmissive cover 1024.

A method for making the jacketed LED assembly will now be explained with reference to FIG. 20. Molding is performed with mold die 1050 and a counterpart mold die (not shown). The mold die 1050 includes a cavity 1052, an upper opening 1054, and a lower opening 1056. The LED 1000 and the base of cover 1024 are placed on the mold die 1050 and positioned so that the end portions of the electrical wires 1010 and 1012, the exposed portions of the contacts 1006 and 1008, the connectors 1014 and 1016, and the contact separator 1022 are disposed in the mold cavity 1052. The lens 1004 extends through the upper opening 1054 of the mold die 1050 to situate the lens 1002 outside the mold die 1050. Likewise, the majority of the light transmissive cover 1024 is situated outside of the mold die 1050. The electrical wires 1010 and 1012 extend through the lower opening 1056 of the mold die 1050.

The mold process and techniques will now be described. Vertical injection molding equipment is preferred as the easiest and most efficient for machine operators to align the assembled LED lens, contact wire, and light transmissive cover base inside the injection mold cavity (cavities).

Significant to this waterproof, molded process is selecting a molding temperature compatible with LED lens encapsulating material. LED lenses 1002 are normally formed using an optical grade epoxy. The encapsulating epoxy properties will vary between manufacturers. Further variations in epoxy material are found when flame retardant compounds are added to the epoxy. At certain temperature thresholds epoxy material will begin to soften, transitioning back into liquid form. This is known in the art as TG, or Glass Transition temperature. Exceeding the TG temperature of the LED epoxy material during the molding, or jacketing process will soften the LED lens material, damaging the internal structure of the LED lamp. This is particularly true of this jacketing, or molding process as heat from molding is first conducted by the LED contacts (1006 and 1008). This causes softening of the epoxy surrounding the LED "wire bond" (electrical connection inside the LED lamp completing the circuit from the LED chip to the wire frame or contacts) and causing disruption of wire bond contact.

Mold temperature is not of concern when jacketing, or "over-molding" conventional, incandescent lamps as the melting point of the glass "bulb" material is considerably higher than that of the jacketing plastic material.

For jacketing, or over-molding LED lamps one first determines the TG temperature of the encapsulating epoxy used. Second, the mold temperature and duration of the injection (jacketing) process are adjusted so the TG temperature is not exceeded. Pre-warming the injection material (PVC, PP, PS, etc.) in its raw granular, or pellet form will greatly assist material flow, reduce air pockets, or voids in the finished jackets, as well as reduce molding duration and temperature.

According to another embodiment of the invention, a light string comprising a plurality of LED assemblies is provided, in which at least one of the LED assemblies comprises a jacketed LED assembly. More preferably, a plurality or all of the LED assemblies are jacketed. The jacketed LED assemblies may have constructions as described above and as illustrated in FIGS. 18 and 19.

In the event that LED assemblies of a light string are to be individually jacketed, the jacketing process may be conducted simultaneously on two or more LED assemblies by use of a corresponding number of molds, or one or more molds containing multiple cavities for simultaneous jacketing of multiple LED lamp and contact wire assemblies. Concurrent practice of this molding technique will improve process efficiency.

The jacketed LED assembly of this invention may be used in various systems and light strings. Preferred light string systems with which the jacketed LED assembly of aspects of this invention may be used are described in detail below. It should be understood that the following description and attached drawings of preferred devices, apparatuses, assemblies, methods, and the like are exemplary, but not exhaustive as to the scope of environments in which the jacketed LED assemblies and light strings of the present invention may be used.

The term "alternating current voltage", sometimes abbreviated as "VAC", as used herein occasionally refers to a numerical amount of volts, for example, "220 VAC". It is to be understood that the stated number of alternating current volts is the nominal voltage which cycles continuously in forward and reverse bias and that the actual instantaneous voltage at a given point in time can differ from the nominal voltage number.

In accordance with an embodiment of the present invention, an LED light string employs a plurality of LEDs wired in series-parallel form, containing at least one series block of multiple LEDs. The series block size is determined by the ratio of the standard input voltage (e.g., either 110 VAC or 220 VAC) to the drive voltage(s) of the LEDs to be employed (e.g., 2 VAC). Further, multiple series blocks, if employed, are each of the same LED configuration (same number and kinds of LEDs), and are wired together along the string in parallel. LEDs of the light string may comprise either a single color LED or an LED including multiple sub-dies each of a different color. The LED lenses may be of any shape, and may be clear, clear-color, or diffuse-color. Moreover, each LED may have internal circuitry to provide for intermittent on-off blinking and/or intermittent LED sub-die color changes. Individual LEDs of the light string may be arranged continuously (using the same color), or periodically (using multiple, alternating CIP colors), or pseudo-randomly (any order of multiple colors). The LED light string may provide an electrical interface to couple multiple light strings together in parallel, and physically from end to end. Fiber optic bundles or strands may also be coupled to individual LEDs to diffuse LED light output in a predetermined manner.

An LED light string of embodiments of the present invention may have the following advantages. The LED light string may last far longer and require less power consumption than light strings of incandescent lamps, and the light string may be safer to operate since less heat is generated. The LED light string may have reduced cost of manufacture by employing series-parallel blocks to allow operation directly from a standard household 110 VAC or 220 VAC source, either without any additional circuitry (AC drive), or with only minimal circuitry (DC drive). In addition, the LED light string may allow multiple strings to be conveniently connected together, using standard 110 VAC or 220 VAC plugs and sockets, desirably from end-to-end.

Direct AC drive of LED light string avoids any power conversion circuitry and additional wires; both of these items add cost to the light string. The additional wires impose additional mechanical constraint and they may also detract aesthetically from the decorative string. However, direct AC drive results in pulsed lighting. Although this pulsed lighting cannot be seen at typical AC drive frequencies (e.g. 50 or 60 Hz), the pulsing apparently may not be the most efficient use of each LED device because less overall light is produced than if the LEDs were continuously driven using DC. However, this effect may be compensated for by using higher LED current during each pulse, depending on the pulse duty factor. During "off" times, the LED has time to cool. It is shown that this method can actually result in a higher efficiency than DC drive, depending on the choice of AC current.

FIG. 1 shows the embodiment of an LED light string in accordance with the present invention, and as preferred primarily through AC drive. In FIG. 1, the two block diagrams correspond to an exemplary string employing 100 LEDs, for either 110 VAC (top diagram) or 220 VAC (bottom diagram) standard household current input (e.g., 50 or 60 Hz). In the top block diagram of FIG. 1A, the input electrical interface consists merely of a standard 110 VAC household plug 101 attached to a pair of drive wires.

With the average LED drive voltage assumed to be approximately 2.2 VAC in FIG. 1A, the basic series block size for the top block diagram, corresponding to 110 VAC input, is approximately 50 LEDs. Thus, for the 110 VAC version, two series blocks of 50 LEDs 102 are coupled in parallel to the drive wires along the light string. The two drive wires for the 110 VAC light string terminate in a standard 110 VAC household socket 103 to enable multiple strings to be connected in parallel electrically from end-to-end.

Figure 1B:
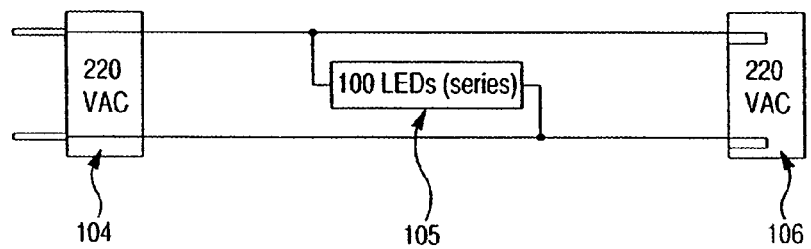

In the bottom block diagram of FIG. 1B, the input electrical interface likewise consists of a standard 220 VAC household plug 104 attached to a pair of drive wires. With again the average LED drive voltage assumed to be approximately 2.2 VAC in FIG. 1B, the basic series block size for the bottom diagram, corresponding to 220 VAC input, is 100 LEDs. Thus, for the 220 VAC version, only one series block of 100 LEDs 105 is coupled to the drive wires along the light string. The two drive wires for the 220 VAC light string terminate in a standard 220 VAC household socket 106 to enable multiple strings to be connected in parallel from end-to-end. Note that for either the 110 VAC or the 220 VAC light string, the standard plug and socket employed in the string varies in accordance to the country in which the light string is intended to be used.

Whenever AC drive is used and two or more series are incorporated in the light string, the series blocks may each be driven by either the positive or negative half of the AC voltage cycle. The only requirement of this embodiment is that, in each series block, the LEDs are wired with the same polarity; however the series block itself, since driven in parallel with the other series blocks, may be wired in either direction, using either the positive or the negative half of the symmetric AC electrical power cycle.

Figure 2A:
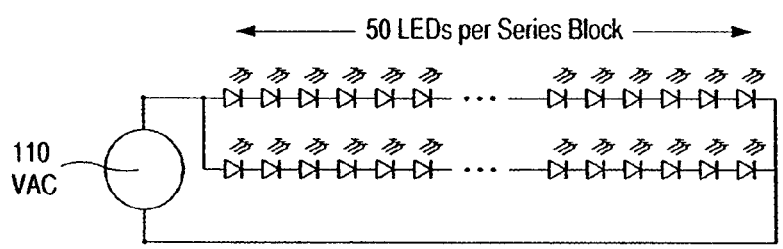
FIG. 2A shows a schematic diagrams of an embodiment of this invention in which the diodes of the 50 LEDs (series) blocks 102 of FIG. 1 are connected in the same direction.
Figure 2B:
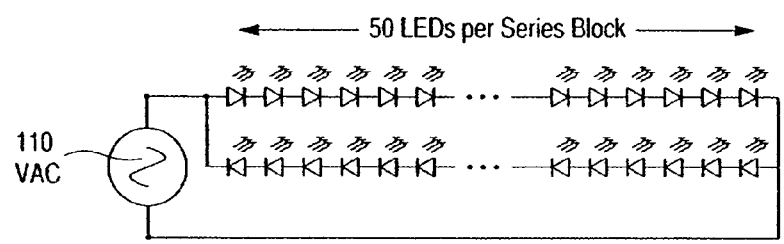
FIG. 2B Shows a schematic diagrams of an embodiment of this invention in which the diodes of the 50 LEDs (series) blocks 102 of FIG. 1 are connected in the reverse direction.

FIGS. 2A and 2B show two schematic diagram implementations of the top diagram of FIG. 1A, where the simplest example of AC drive is shown that uses two series blocks of 50 LEDs, connected in parallel and powered by 110 VAC. In the top schematic diagram of FIG. 2A both of these LED series blocks are wired in parallel with the polarity of both blocks in the same direction (or, equivalently, if both blocks were reversed). With this block alignment, both series blocks flash on simultaneously, using electrical power from the positive (or negative, if both blocks were reversed) portion of the symmetric AC power cycle. A possible advantage of this configuration is that, since the LEDs all flash on together at the cycle rate (60 Hz for this example), when the light string flashes on periodically, it is as bright as possible.

The disadvantage of this configuration is that, since both blocks flash on simultaneously, they both draw power at the same time, and the maximum current draw during this time is as large as possible. However, when each flash occurs, at the cycle rate, the amount of light flashed is maximal. The flash rate, at 50-60 Hz, cannot be seen directly by human eye and is instead integrated into a continuous light stream.

The bottom schematic diagram FIG. 2B shows the alternative implementation for the top diagram of FIG. 1A, where again, two series blocks of 50 LEDS are connected in parallel and powered by 110 VAC.

In this alignment, the two series blocks are reversed, relative to each other, in polarity with respect to the input AC power. Thus, the two blocks flash alternatively, with one block flashing on during the negative portion of each AC cycle. The symmetry, or "sine-wave" nature of AC allows this possibility. The advantage is that, since each block flashes alternatively, drawing power during opposite phases of the AC power, the maximum current draw during each flash is only half of that previously (i.e., compared when both blocks flash simultaneously). However, when each flash occurs, at twice the cycle rate here, the amount of light flashed is reduced (i.e., half the light than if two blocks were flashing at once as previously illustrated). The flash rate, at 100-120 Hz, cannot be seen directly by the human eye and is instead integrated into a continuous light stream.

The trade-off between reversing series blocks when two or more exist in an AC driven circuit is influenced primarily by the desire to minimize peak current draw. A secondary influence has to do with the properties of the human eye in integrating periodic light flashes. It is well known that the human eye is extremely efficient in integrating light pulses rapid enough to appear continuous. Therefore, the second form of the light string is preferred from a power draw standpoint because the effect on human perception is insignificant.

For AC drive with non-standard input (e.g., three-phase AC) the series blocks may similarly be arranged in polarity to divide power among the individual cycles of the multiple phase AC. This may result in multiple polarities employed for the LED series blocks, say three polarities for each of the three positive or negative cycles.

Figure 3A:
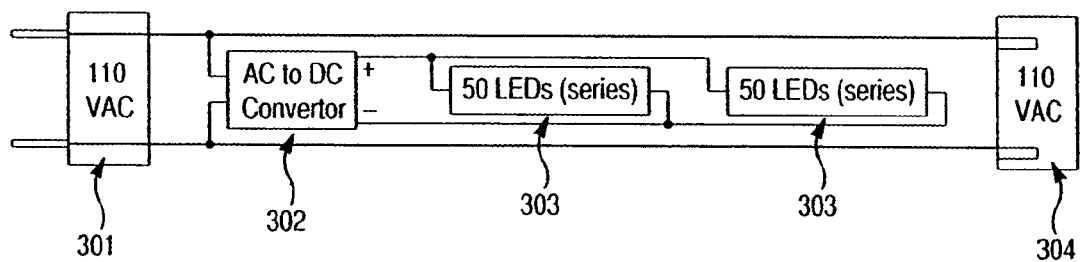
FIGS. 3A and 3B show two example block diagrams of the light string in its embodiment preferred alternatively, with one diagram for a 110 VAC common household input electrical source (e.g., 60 Hz) and one diagram for a 220 VAC common household (e.g., 50 Hz) input electrical source.

As an alternative preference to AC drive, FIG. 3 shows two block diagrams that correspond to an exemplary string employing 100 LEDs and DC drive, for either 110 VAC (top diagram) or 220 VAC (bottom diagram) standard household current input (e.g., 50 or 60 Hz). In the top block diagram of FIG. 3A, the input electrical interface consists of a standard 110 VAC household plug 301 attached to a pair of drive wires, followed by an AC-to-DC converter circuit 302. As in FIG. 1, with the average LED drive voltage assumed to be approximately 2.2 VAC in FIG. 3A, the basic series block size for the top block diagram, corresponding to 110 VAC input, is approximately 50 LEDs. Thus, for the 110 VAC version, two series blocks of 50 LEDs 303 are coupled in parallel to the output of the AC-to-DC converter 302 using additional feed wires along the light string. The two drive wires for the 110 VAC light string terminate in a standard 110 VAC household socket 304 to enable multiple strings to be connected in parallel electrically from end-to-end.

Figure 3B:
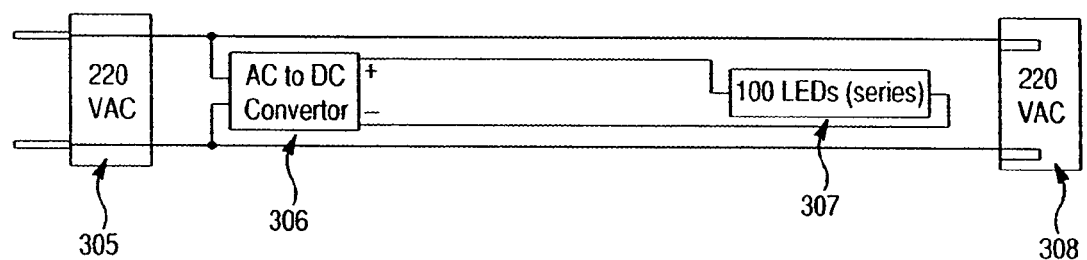

In the bottom block diagram of FIG. 3B, the input electrical interface likewise consists of a standard 220 VAC household plug 305 attached to a pair of drive wires, followed by an AC-to-DC converter circuit 306. With again the average LED drive voltage assumed to be approximately 2.2 VAC in FIG. 3B, the basic series block size for the bottom diagram, corresponding to 220 VAC input, is 100 LEDs. Thus, for the 220 VAC version, only one series block of 100 LEDs 307 is coupled to the output of the AC-to-DC converter 306 using additional feed wires along the light string. The two drive wires for the 220 VAC light string terminate in a standard 220 VAC household socket 308 to enable multiple strings to be connected in parallel from end-to-end. Note that for either the 110 VAC or the 220 VAC light string, the standard plug and socket employed in the string varies in accordance with the country in which the light string is intended to be used.

Figure 4:
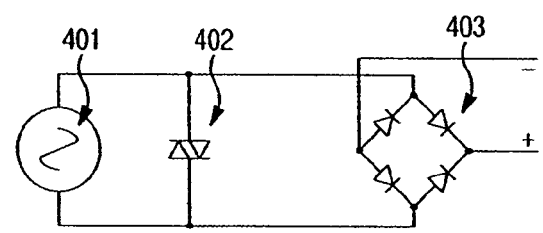
FIG. 4 shows an example schematic diagram of the AC-to-DC power supply corresponding to the two block diagrams in FIG. 3 for either the 110 VAC or the 220 VAC input electrical source.

FIG. 4 shows an example schematic electrical diagram for the AC-to-DC converter employed in both diagrams of FIG. 3. The AC input to the circuit in FIG. 1 is indicated by the symbol for an AC source 401. A varistor 402 or similar fusing device may optionally be used to ensure that voltage is limited during large power surges. The actual AC to DC rectification is performed by use of a full-wave bridge rectifier 403. This bridge rectifier 403 results in a rippled DC current and therefore serves as an example circuit only. A different rectification scheme may be employed, depending on cost considerations. For example, one or more capacitors or inductors may be added to reduce ripple at only minor cost increase. Because of the many possibilities, and because of their insignificance, these and similar additional circuit features have been purposely omitted from FIG. 4.

Figure 5A:
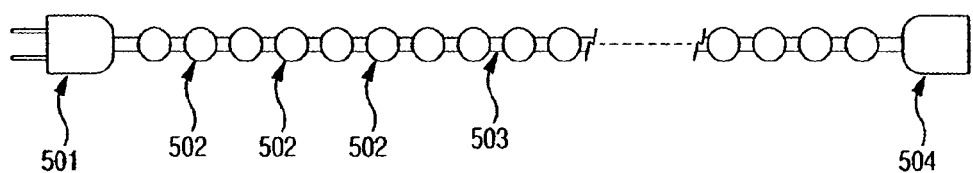
FIGS. 5A and 5B show example pictorial diagrams of the manufactured light string in either its "straight" or "curtain" form (either form may be manufactured for 110 VAC or 220 VAC input).
Figure 5B:
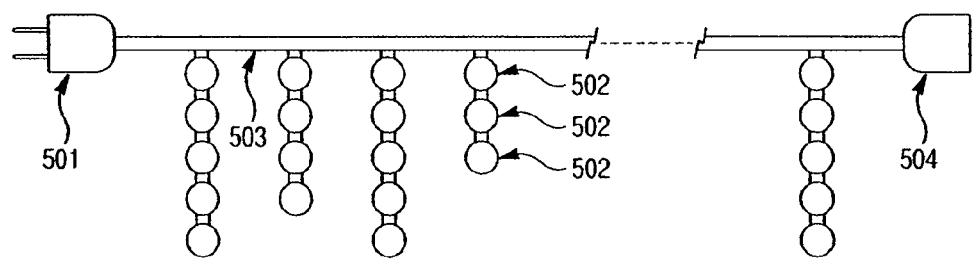

For either the 110 VAC or the 220 VAC version of the LED light string, and whether or not an AC to-DC power converter is used, the final manufacturing may be a variation of either the basic "straight" string form or the basic "curtain" string form, as shown in the top and bottom pictorial diagrams in FIGS. 5A and 5B. In the basic "straight" form of the light string, the standard (110 VAC or 220 VAC) plug 501 is attached to the drive wires which provide power to the LEDs 502 via the series-parallel feeding described previously. The two drive and other feed wires 503 are twisted together along the length of the light string for compactness and the LEDs 502 in the "straight" form are aligned with these twisted wires 503, with the LEDs 502 spaced uniformly along the string length (note drawing is not to scale). The two drive wires in the "straight" form of the light string terminate in the standard (correspondingly, 110 VAC or 220 VAC) socket 504. Typically, the LEDs are spaced uniformly every four inches.

In the basic "curtain" form of the light string, as shown pictorially in the bottom diagram of FIGS. 5A and 5B, the standard (110 VAC or 220 VAC) plug 501 again is attached to the drive wires which provide power to the LEDs 502 via the series-parallel feeding described previously. The two drive and other feed wires 503 are again twisted together along the length of the light string for compactness. However, the feed wires to the LEDs are now twisted and arranged such that the LEDs are offset from the light string axis in small groups (groups of 3 to 5 are shown as an example). The length of these groups of offset LEDs may remain the same along the string or they may vary in either a periodic or pseudo-random fashion.

Within each group of offset LEDs, the LEDs 502 may be spaced uniformly as shown or they may be spaced nonuniformly, in either a periodic or pseudo-random fashion (note drawing is not to scale). The two drive wires in the "curtain" form of the light string also terminate in a standard (correspondingly 110 VAC or 220 VAC) socket 504. Typically, the LED offset groups are spaced uniformly every six inches along the string axis and, within each group, the LEDs are spaced uniformly every four inches.

In any above version of the preferred embodiment to the LED light string, blinking may be obtained using a number of techniques requiring additional circuitry, or by simply replacing one of the LEDs in each series block with a blinking LED. Blinking LEDs are already available on the market at comparable prices with their continuous counterparts, and thus the light string may be sold with the necessary (e.g., one or two) additional blinkers included in the few extra LEDs.

Figure 6:
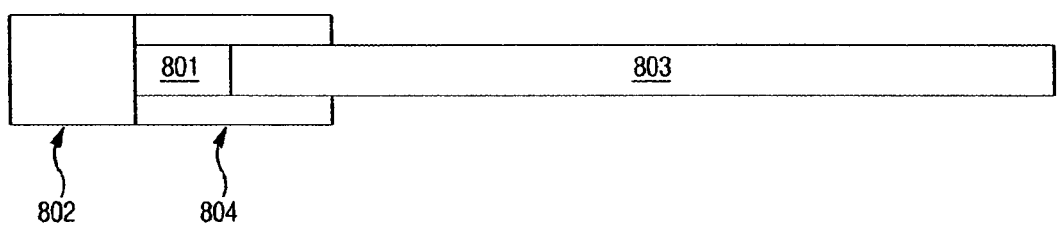
FIG. 6 shows an example pictorial diagram of a fiber optic "icicle" attached to an LED and its housing in the light string, where the "icicle" diffuses the LED light in a predetermined manner.

Typically, the LEDs in the light string will incorporate a lens for wide-angle viewing. However, it is also possible to attach fiber optic bundles or strands to the LEDs to spatially diffuse the LED light in a predetermined way for a desirable visual effect. In such case, the LED lens is designed to create a narrow-angle light beam (e.g., 20 degree beamwidth or less) along its axis, to enable the LED light to flow through the fiber optics with high coupling efficiency. An example of the use of fiber optics is shown in FIG. 6, where a very lossy fiber optic rod is employed with intention for the fiber optic rod to glow like an illuminated "icicle." In FIG. 6, the LED 801 and its housing 802 may be attached to the fiber optic rod 803 using a short piece of tubing 804 that fits over both the LED lens and the end of the fiber optic rod (note that the drawing is not to scale). An example design uses a cylindrical LED lens with a narrow-angle end beam, where the diameter of the LED lens and the diameter of the fiber optic rod are the same (e.g., 5 mm or 3/16 inches). The fiber optic rod 803 is typically between three to eight inches in length and may be either uniform in length throughout the light string, or the fiber optic rod length may vary in either a periodic or pseudo-random fashion.

Although the fiber optic rod 803 in FIG. 6 could be constructed using a variety of plastic or glass materials, it may be preferred that the rod is made in either a rigid form using clear Acrylic plastic or clear crystal styrene plastic, or in a highly flexible form using highly plasticized Polyvinyl Chloride (PVC). These plastics are preferred for safety, durability, light transmittance, and cost reasons. It may be desirable to add into the plastic rod material either air bubbles or other constituents, such as tiny metallic reflectors, to achieve the designed measure of lossiness for off-axis glowing (loss) versus on-axis light conductance. Moreover, it is likely to be desirable to add UV inhibiting chemicals for longer outdoor life, such as a combination of hindered amine light stabilizer (HALS) chemicals. The tubing 804 that connects the fiber optic rod 803 to its LED lens 801 may also made from a variety of materials, and be specified in a variety of ways according to opacity, inner diameter, wall thickness, and flexibility. From safety, durability, light transmittance, and cost reasons, it may be preferred that the connection tubing 804 be a short piece (e.g., 10 mm in length) of standard clear flexible PVC tubing (containing UV inhibiting chemicals) whose diameter is such that the tubing fits snugly over both the LED lens and the fiber optic rod (e.g., standard wall tubing with 1/4 inch outer diameter). An adhesive may be used to hold this assembly more securely.

The method of determining and calculating the preferred LED network that provides stable and functioning operation will now be described.

Figure 7:
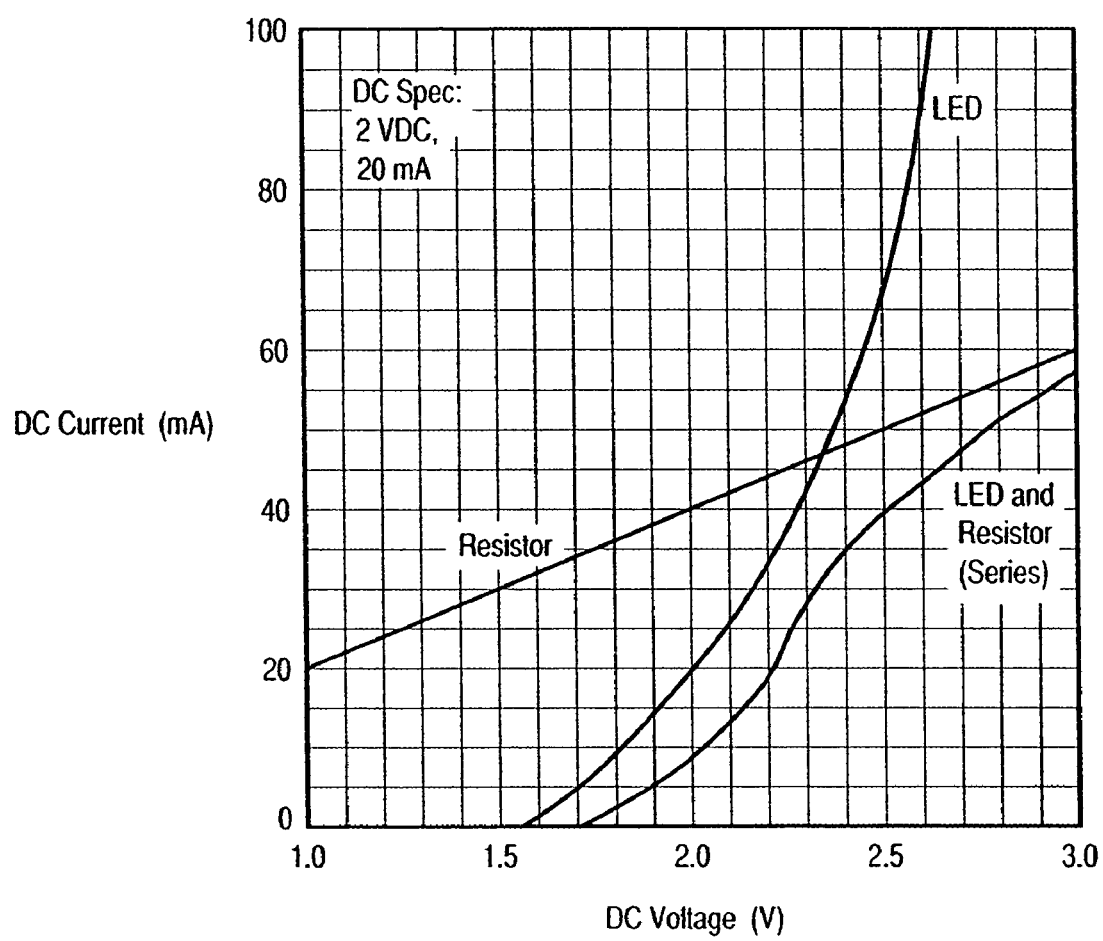
FIG. 7 is a graph of current versus voltage for diodes and resistors.

Many current-limiting designs use a single impedance element in series between the LED network and the power supply. Current-saturated transistors are a less common method of current limiting. A resistor is often used for the impedance element due to low cost, high reliability and ease of manufacture from semiconductors. For pulsed-DC or AC power, however, a capacitor or inductor may instead be used for the impedance element. With AC power, even though the waveform shape may be changed by capacitors or inductors, the overall effect of these reactive elements is basically the same as a resistor, in adding constant impedance to the circuit due to the single AC frequency involved (e.g., 60 Hz). In any case, the fundamental effect of current-limiting circuitry is to partially linearize or limit the highly nonlinear current versus voltage characteristic response curve of the diode, as shown in FIG. 7 for a single resistor element.

Figure 8A:
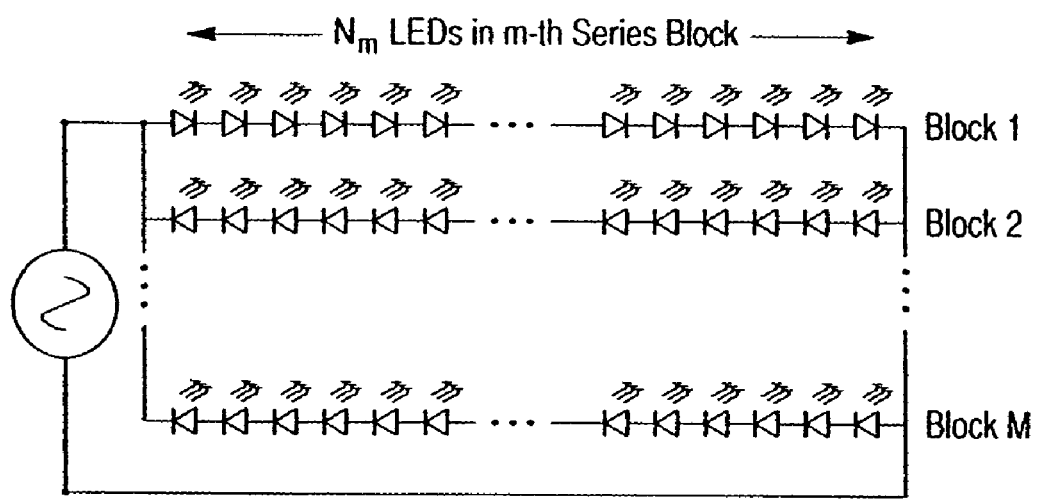
FIGS. 8A and 8B are a schematic and block diagrams of direct drive embodiments.
Figure 8B:
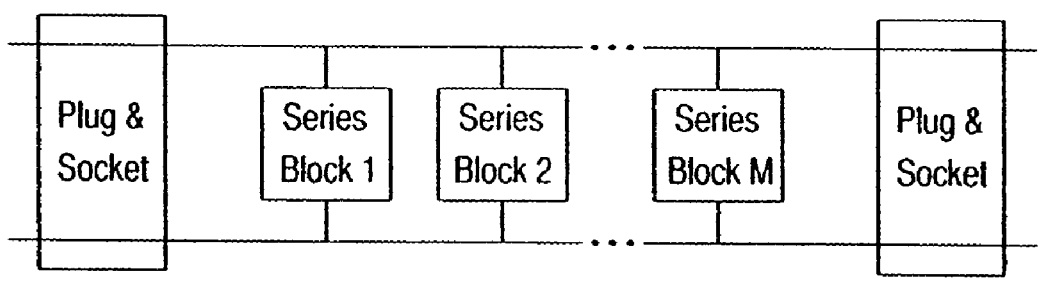

FIGS. 8A and 8B show the preferred embodiment of the invention, wherein a network of diodes, consisting of LEDs, is directly driven by the AC source without any current-limiting circuitry. FIG. 8A is a general schematic diagram showing M series blocks of LEDs directly connected in parallel to the AC source where, for the m-th series block, there are $N_m$ $\{1 \leq m \leq M\}$ LEDs directly connected to each other in series. Also shown is a reversal of polarity between some series blocks, placing these blocks in opposite AC phase, in order to minimize peak current in the overall AC circuit. FIG. 8B is a block diagram of the above schematic, where a combination plug/socket is drawn explicitly to show how multiple devices can be directly connected either on the same end or in an end-to-end fashion, without additional power supply wires in between. This end-to-end connection feature is particularly convenient for decorative LED light strings.

The invention in FIGS. 8A and 8B may have additional circuitry, not explicitly drawn, to perform functions other than current-limiting. For example, logic circuits may be added to provide various types of decorative on-off blinking. A full-wave rectifier may also be used to obtain higher duty factor for the diodes which, without the rectifier, would turn on and off during each AC cycle at an invisibly high rate (e.g., 50 or 60 Hz). The LEDs themselves may be a mixture of any type, including any size, shape, material, color or lens. The only vital feature of the diode network is that all diodes are directly driven from the AC power source, without any form of current-limiting circuitry external to the diode.

In order to directly drive a network of diodes without current-limiting circuitry, the voltage of each series block of diodes must be matched to the input source voltage. This voltage matching requirement for direct AC drive places fundamental restrictions on the number of diodes on each diode series block, depending on the types of diodes used. For the voltage to be "matched," in each series block, the peak input voltage, $V_{peak}$, must be less than or equal to the sum of the maximum diode voltages for each series block. Mathematically, let $V_{peak}$ be the peak voltage of the input source and let $V_{max}(n,m)$ be the maximum voltage for the n-th diode $\{1 \leq n \leq N_m\}$ of the m-th series block $\{1 \leq m \leq M\}$. Then, for each m, the peak voltage must be less than or equal to the m-th series block voltage sum, $$V_{peak} \leq \Sigma_n V_{max}(n,m) \tag{1}$$

where $\{1 \leq n \leq N_m\}$ in the sum over n. For simpler cases where all $N_m$ diodes in the m-th series block are of the same type, each with $V_{max}$, then $V_{peak} \leq N_m V_{max}$.

The maximum voltage $V_{max}$ of each diode is normally defined by the voltage which produces diode maximum current, $I_{max}$. However, when diodes of different types are used in a series block, the series block value of $I_{max}$ is the minimum of all individual diode values for $I_{max}$ in the series block. Thus, if the m-th series block has $N_m$ diodes, with the n-th diode in the m-th series block having maximum current $I_{max}(n,m)$, then the value of $I_{max}$ for the m-th series block, $I_{max}(m)$, is determined by the minimum of these $N_m$ individual diode values, $$I_{max}(m) = \min[I_{max}(n,m); \{1 \leq n \leq N_m\}]. \tag{2}$$

The maximum voltage $V_{max}$ of each diode in the m-th series block is thus defined as the voltage which produces the m-th series block maximum current $I_{max}(m)$. For simpler cases where all diodes in a series block are of the same type, each with maximum current $I_{max}$, then $I_{max}(m) = I_{max}$.

For AC or any other regularly varying input voltage, there is an additional requirement to direct drive voltage matching. Here, in a similar way to peak voltage above, the average, or RMS, voltage of the source, $V_{rms}$, must also be less than or equal to the sum of the average diode voltages, $V_{avg}$, for each series block. Mathematically, let $V_{rms}$ be the RMS voltage of the input source and let $V_{avg}(n,m)$ be the average forward voltage for the n-th diode $\{1 \leq n \leq N_m\}$ of the m-th series block $\{1 \leq m \leq M\}$. Then, for each m, the RMS voltage must be less than or equal to the m-th series block voltage sum, $$V_{rms} \leq \Sigma_n V_{avg}(n,m) \tag{3}$$

where $\{1 \leq n \leq N_m\}$ in the sum over n. For simpler cases where all $N_m$ diodes in the m-th series block are of the same type, each with $V_{rms}$, then $V_{rms} \leq N_m V_{avg}$.

In a similar way to the peak voltage above, the average voltage of each diode, $V_{avg}$ is normally defined by the voltage which produces diode average current, $I_{avg}$. However, when diodes of different types are used in a series block, the series block value of $I_{avg}$ is the minimum of all individual diode values for $I_{avg}$ in the series block. Thus, if the m-th series block has $N_m$ diodes, each with average current $I_{avg}(n,m)$ then the value of $I_{avg}$ for the M-th series block, $I_{avg}(m)$, is determined by the minimum of these $N_m$ values, $$I_{avg}(m) = \min[I_{avg}(n,m); \{1 \leq n \leq N_m\}]. \tag{4}$$

The average voltage $V_{avg}$ of each diode in the m-th series block is thus defined as the voltage which produces the m-th series block average current $I_{avg}(m)$. For simpler cases where all diodes in a series block are of the same type, each with average current $I_{avg}$, then $I_{avg}(m) = I_{avg}$.

Note that the term "average", rather than "RMS," is used to distinguish RMS diode values from RMS input voltage values because diode values are always positive (nonnegative) for all positive or negative input voltages considered, so that diode RMS values are equal to their simple averages. Note also that in past LED designs, the specified DC value for $I_{nom}$ is equated to the average diode value, $I_{avg}$. LEDs are always specified in DC, and the specified DC value for $I_{nom}$ results from a tradeoff between LED brightness and LED longevity. In the direct AC drive analysis below, this tradeoff between brightness and longevity results in values for $I_{avg}$ that are generally different than $I_{nom}$. The direct AC drive value for $V_{avg}$ is thus also generally different than the LED specified DC value $V_{nom}$.

Figure 9:
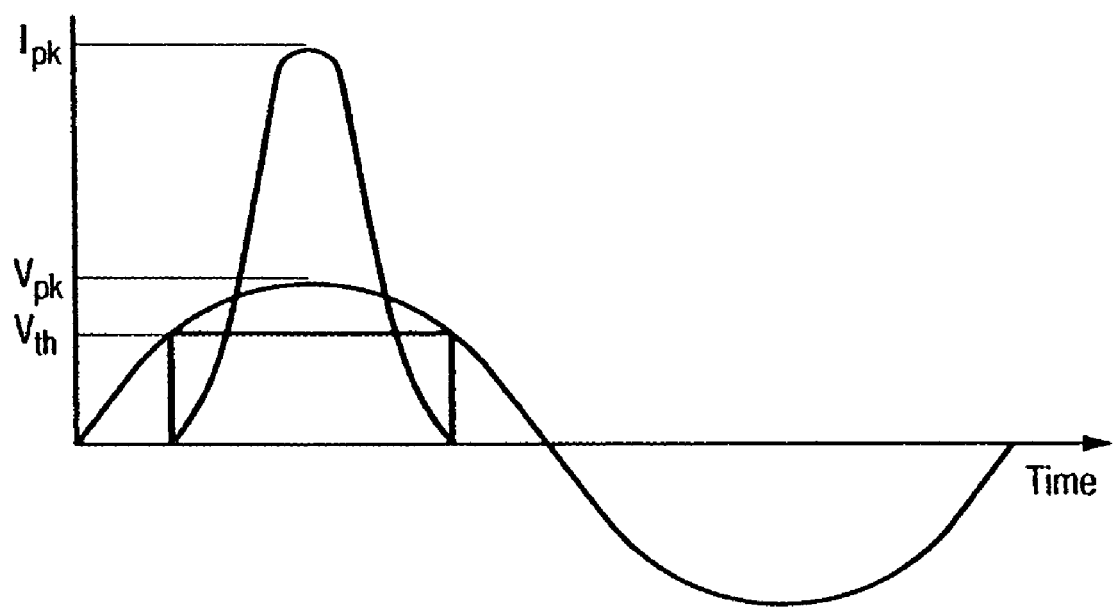
FIG. 9 is a plot showing the alternating current time response of a diode.

LEDs are specified in terms of DC values, $V_{nom}$ and $I_{nom}$. For AC power, since $V_{avg}$ is an AC quantity and $V_{nom}$ is a DC quantity, they are fundamentally different from each other. This basic difference between AC and DC values arises from the nonlinear relationship between diode voltage and diode current. Consider AC voltage input to a diode as shown for one period in FIG. 9, where the peak voltage shown, $V_{pk}$, is less than or equal to the diode maximum voltage, $V_{max}$. For AC voltages below the diode voltage threshold, $V_{th}$, the current is zero. As the voltage increases above $V_{th}$ to its peak value, $V_{pk}$, and then falls back down again, the diode current rises sharply in a nonlinear fashion, in accordance to its current versus voltage characteristic response curve, to a peak value, $I_{pk}$, and then the diode current falls back down again to zero current in a symmetric fashion. Since the voltage was chosen such that $V_{pk} \leq V_{max}$, then the peak diode current satisfies $I_{pk} \leq I_{max}$. The average diode current, $I_{avg}$, is obtained by integrating the area under the current spike over one full period.

The central problem of AC voltage matching in equations (1) through (4) for direct drive of diodes is to first determine peak AC diode current, $I_{peak}$ and average AC diode current, $I_{avg}$, as a function of $V_{rms}$ or, equivalently, the peak AC voltage $V_{peak} = \sqrt{2} V_{rms}$. Since the nonlinear relationship for diode current versus voltage is not known in closed form, these diode AC current versus input AC voltage relationships cannot be obtained in closed form. Moreover, the nonlinear diode AC current versus input AC voltage relationships vary for different diode types and materials. In all cases, since the diode current versus voltage characteristic curve, near the practical operating point $V_{nom}$, is a convex-increasing function, i.e., its slope is positive and increases with voltage, the average diode current $I_{avg}$ that results from a given RMS value of AC voltage is always higher than the diode current that would be achieved for a DC voltage input having the same value. Because of this, specified DC values for diode voltage cannot be directly substituted for AC diode voltage values. Instead, the characteristic diode AC current versus input AC voltage relationships must be found for the AC waveform of interest.

Figure 10:
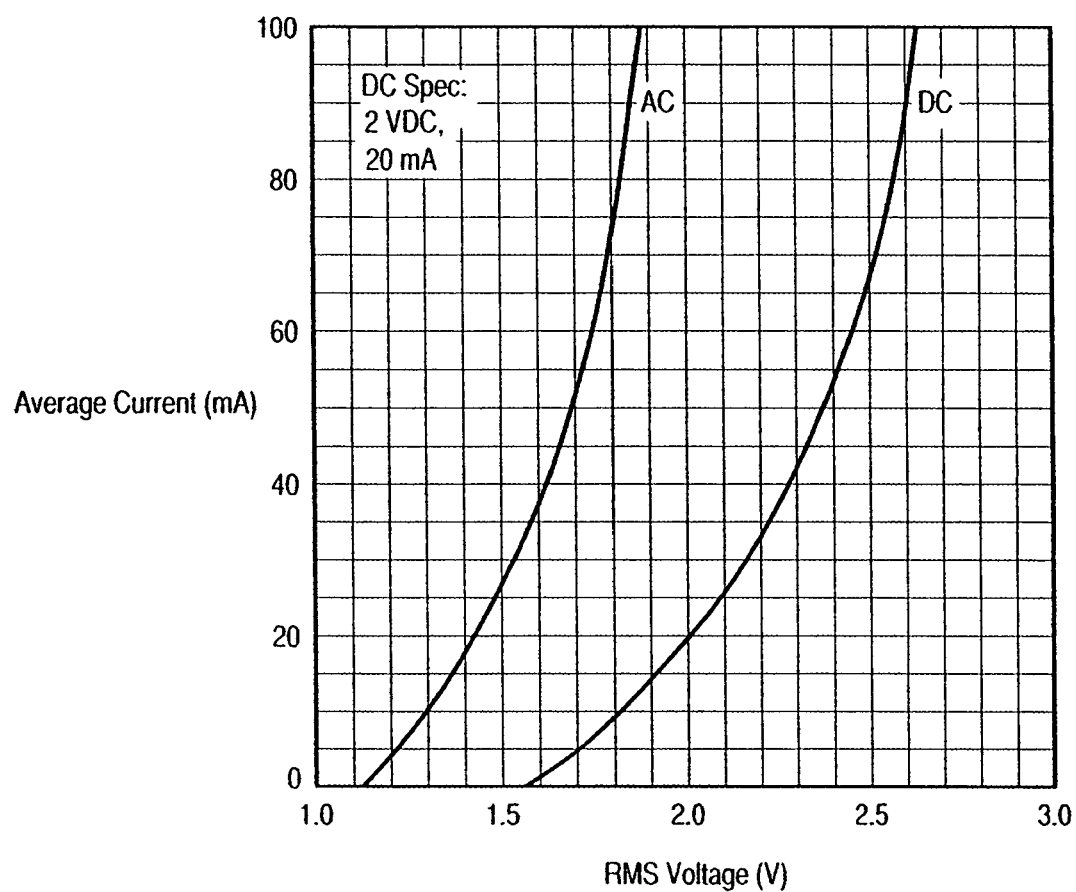
FIG. 10 is a graph showing measured diode average current response for alternating current and direct current.

The characteristic diode AC current versus voltage relationships may be found by measuring diode current values $I_{avg}$ and $I_{peak}$ as a function of RMS voltage, $V_{rms}$, using variable voltage AC source. A number of alike diodes are used in these measurements to obtain good statistics. If different diode types or materials are considered, then each measurement procedure is repeated accordingly. FIG. 10 shows a typical measurement result for average current, $I_{avg}$, where the diode used has specified nominal values of $V_{nom} = 2$ VDC and $I_{nom} = 20$ mA.

The average AC current curve is always to left of the DC current curve in FIG. 10. Thus, FIG. 10 shows that if one used DC voltages for the diode in an AC circuit, the resulting average AC diode current would be much higher than the DC current expected. Recall that in the prior art, where a number of alike 2 VDC LEDs are connected in series with a current-limiting resistor, a maximum number N of LEDs is defined by summing the individual LED voltages and equating to the RMS input voltage. For a 120 VAC source, this maximum number is N=60 LEDs. The prior art then subtracts five or ten LEDs from this maximum to obtain a design number, and computes the resistor value using the difference between the AC input RMS voltage and the sum of these DC LED voltages. This design is marginally stable, and then becomes unstable, as the number of LEDs subtracted becomes smaller. Instability is proven in FIG. 10, by considering the limit case where a maximum number N=60 of LEDs are used and hence no LEDs are subtracted. In this limit case, one might argue that a resistor must be used anyway, but according to this design formula, presented for five or ten LEDs subtracted, the resistor value in this case would equal zero. As FIG. 10 shows, if the resistor value were zero, i.e., the resistor is omitted, instead of the DC design value of $I_{nom} = 20$ mA for LED current (the rightmost, DC, curve at 2.0 VDC), the LED average AC current will be off the scale, higher than the maximum diode current $I_{max} = 100$ mA (the leftmost, AC, curve at 1.87 VAC), and the device will fail immediately or almost immediately.

Figure 11:
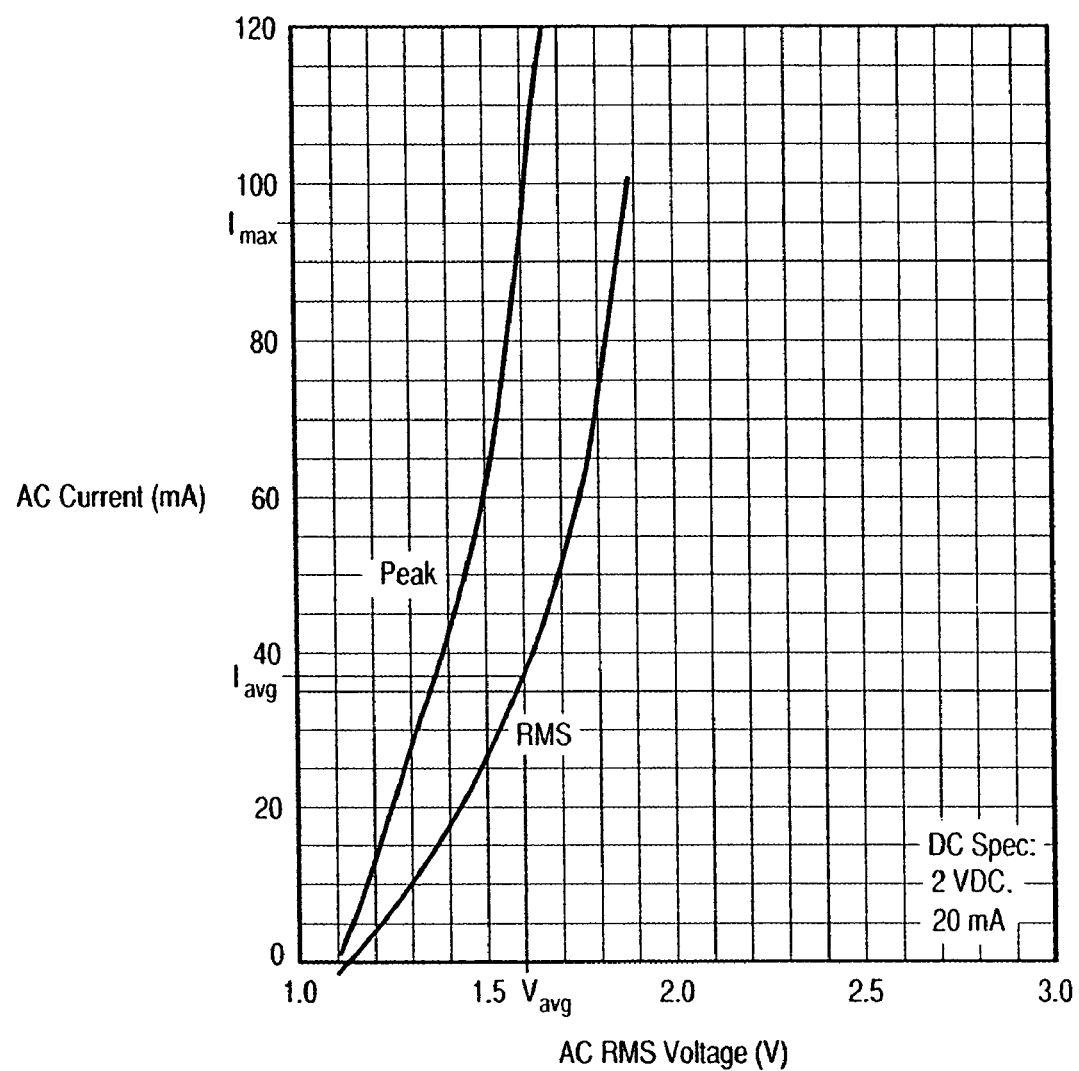
FIG. 11 is a graph showing measured AlInGaP LED average and maximum AC current responses.

In order to properly perform matching in an direct AC drive design, the characteristic diode AC current versus input AC voltage relationships must be measured and used to specify the AC values for equations (1) through (4). DC specifications and DC diode measurements cannot directly be used in the direct AC drive design, and they are useful only as a guide for theoretical inference, discussed further below. Along with the diode average AC current, the diode peak AC current must also be measured as a function of RMS (or equivalently, peak) input AC voltage. FIG. 11 shows a typical measurement result, where the diode used has specified DC nominal values of $V_{nom} = 2$ VDC and $I_{nom} = 20$ mA.

As stated previously, for an AC design, the LED average AC current, $I_{avg}$, is generally different from the specified LED nominal DC current, $I_{nom}$. Likewise, the LED maximum AC current, $I_{max}$, is also generally different from the specified LED maximum DC current. Choice of these values represent a tradeoff between LED brightness and electrical efficiency versus LED longevity. In general for pulsed-DC or AC input, the LED is off at least part of the time and is therefore has time to cool during off-time while heating during on-time. In order to increase light output and hence electrical efficiency, both the average and the peak diode current values can be raised somewhat above specified DC values and maintain the same longevity, which is defined as the total on-time until, say, 30% loss of light output is incurred—typically at about 100,000 on-time hours. Moreover, these LED average and peak current values can be raised further to increase light output and electrical efficiency at some expense in LED longevity, depending on the on-time duty factor. Higher ambient temperatures are accounted for by lowering, or "derating" these values somewhat.

Figure 13:
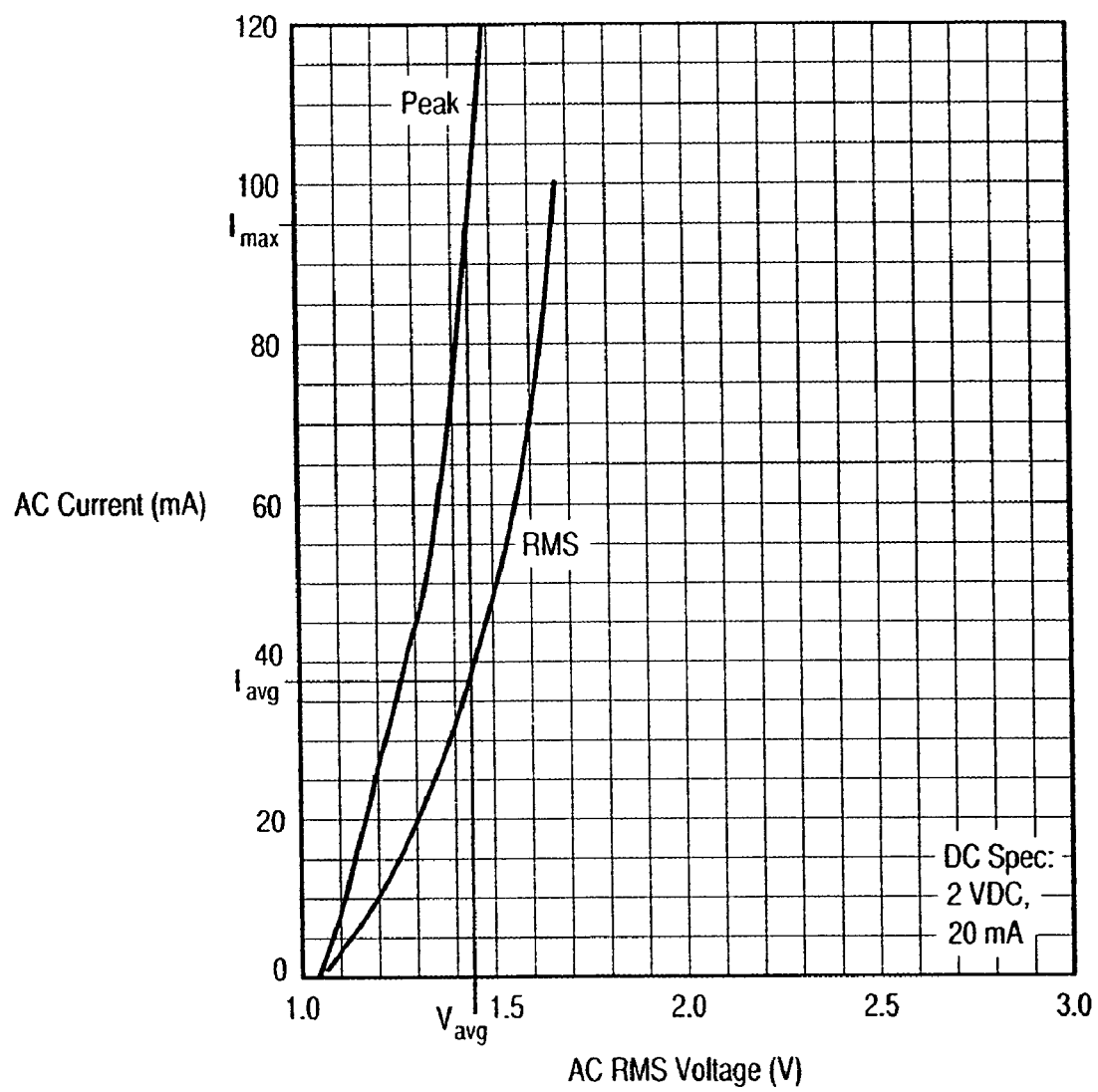
FIG. 13 is a graph showing measured GaAlAs LED average and maximum AC current responses.

In a publication by Hewlett Packard, a number of curves are presented of projected long term light output degradation, for various pulsed-DC duty factors and various average and peak current values, at ambient temperature $T_A = 55°$ C. The AlInGaP LEDs used in this data represents the material commonly used in an LED with specified DC nominal voltage $V_{nom} = 2$ VDC. While results vary somewhat for other LED materials, it can be inferred from this data that, for most LEDs specified at $I_{nom} = 20$ mA, the AC design choice for $I_{avg}$ is approximately in the interval, $$30 \text{ mA} \leq I_{avg} \leq 50 \text{ mA} \tag{5}$$

where the specific value chosen, $I_{avg} = 36$ mA, is indicated in FIG. 13.

Similarly, from the Hewlett Packard data it can be inferred that, for most LEDs with maximum DC current specified at 100 mA, and the AC design choice for $I_{max}$ is approximately, $$I_{max} \leq 120 \text{ mA} \tag{6}$$

where a specific value chosen of $I_{max} = 95$ mA satisfying this, that corresponds to $V_{avg} = 1.6$ VAC and $I_{avg} = 36$ mA, is also indicated in FIG. 11.

To clarify the direct AC drive design, consider again the simpler case where all N LEDs in a series block are of the same type, with each LED specified as before at $V_{nom} = 2$ VDC and $I_{nom} = 20$ mA. Moreover, let the input AC power be the U.S. standard value and assume $V_{rms} = 120$ VAC for voltage matching. With the above values for $I_{max}$ and $I_{avg}$, the maximum and average LED voltages, $V_{max}$ and $V_{avg}$, are determined using AC current versus voltage measurements in FIG. 11 and simplified versions of equations (2) and (4), respectively. The minimum number N of LEDs is determined from these voltages using the input voltage $V_{peak} = \sqrt{2} V_{rms}$ and equations (1) and (3), for maximum and average voltage respectively. Since the value for $I_{max} = 95$ mA was chosen as a lower value than possible by equation (6), corresponding to $V_{avg} = 1.6$ VAC and $I_{avg} = 36$ mA, the maximum voltage becomes $V_{max} = \sqrt{2} V_{avg}$ and equation (1) is automatically satisfied by satisfying equation (3). Solving equation (3) results in the minimum number of N LEDs as, $$V_{rms} \leq N V_{avg} \Rightarrow 120 \leq N(1.6) \Rightarrow N \geq 75 \quad (7)$$

Although the value of N=75 is a convenient number to use for manufacturing and sale of a decorative LED light string, if a different, less convenient, minimum number N of LEDs were computed, the result can be rounded up or down slightly for convenience, provided that the subsequent changes in LED brightness or longevity are acceptable. For example, if the RMS voltage were assumed to be 110 VAC, then the resulting minimum number of LEDs in equation (7) would be $N \geq 69$, and this value may be rounded to a final value of N=70 for convenience, with only slight impact on LED brightness.

Efficiency of the above direct AC drive design example can be estimated by first noting that the average power, $P_{avg}$, consumed by a single LED in the series block is the product of the average voltage and the average current, $P_{avg} = V_{avg} I_{avg}$. This is compared against the optimal DC baseline that uses the specified DC nominal LED power consumption, $P_{nom}$, defined as the product of the nominal voltage and the nominal current, $P_{nom} = V_{nom} I_{nom}$. Using the values given in the above direct AC drive example, there results, $P_{avg} \approx 1.44 P_{nom}$, so that the direct AC drive design consumes 44% more power per LED than the DC baseline. However, to examine efficiency, first let $L_{avg}$ be the average light output power for the direct AC drive design and $L_{DC}$ be the optimal light output power using the DC baseline. This light output power L represents LED efficiency as a device, i.e., how much light the LED can be made to produce. Defining relative device efficiency as the quotient $\epsilon_D = L_{avg}/L_{DC}$ enables the amount of light produced by each LED in direct AC drive design to be compared with the optimal DC baseline. Using an approximation that the LED light output power, L, is proportional to the LED current, I, this LED device efficiency, $\epsilon_D$, is approximately, $$\epsilon_D = L_{avg}/L_{DC} \approx I_{avg}/I_{nom} = 36/20 = 1.8 \quad (8)$$

so that the direct AC design example makes about 80% more use of each LED as a light producing device than the optimal DC baseline. In other words, for each LED used, the direct AC drive design produces about 80% more light than the maximum possible by a DC design based on nominal LED values. Although this factor of 80% light increase appears to be large, its effect is diminished by human perception. According to the well known law by Stevens, human perceptions follow a continuum given by the power relationship, $$B \propto L^\rho \quad (9)$$

where L is the stimulus power, B is the perceived brightness intensity, and exponent $\rho$ is a parameter that depends on the type of stimulus. For light stimuli, L is the light power in Watts, B is the perceived photopic brightness in lumens, and the exponent is approximately $\rho = \frac{1}{3}$. With this exponent, the 80% increase in light output power offered by the direct AC design example translates into about 22% increase in perceived brightness. Although a smaller realized effect, the direct AC design example does offer an increase, rather than a decrease, in brightness relative to the optimal DC baseline.

LED electrical efficiency, E, is defined by dividing light output power by electrical power used, E=L/P. Defining relative electrical efficiency as the quotient $\epsilon_E = E_{avg}/E_{DC}$ enables the electrical efficiency in direct AC drive design to be compared with the optimal DC baseline. Using again an approximation that the LED light output power, L, is proportional to the LED current, I, there follows, $$\epsilon_E \approx (I_{avg}/P_{avg})/(I_{nom}/P_{nom}) = V_{nom}/V_{avg} = 2.0/1.6 = 1.25 \quad (10)$$

so that the AC direct drive design is about 25% more electrically efficient than the optimal DC baseline. In other words, for a fixed amount of input power, the direct AC design examples produces about 25% more light than the maximum possible by DC based on nominal LED values.

There are two basic reasons for the results in equations (8) and (10). First, the direct drive design does not have current-limiting circuitry to consume power. If this were the only factor involved, the direct AC design efficiency would be 100%, relative to the optimal DC baseline, because the optimal DC baseline is computed without current-limiting circuitry loss. The second basic reason stems from the nonlinear relationship between LED current and voltage. Because this relationship is a convex-increasing function, i.e., its slope is positive and increases with voltage, average AC diode current $I_{avg}$ is always higher than DC current for the same voltage value. This higher AC average current in turn leads to higher average light output, with an approximation showing a proportional relationship. This is a fundamental advantage to the pulsed waveforms over DC that others fail to recognize for AC and instead try to avoid. The nonlinear current versus voltage relationship is further taken advantage of in the direct AC drive design by increasing the average current to a more optimal value, using the fact that the LED has time to cool during the off-time interval in each AC cycle.

Figure 12:
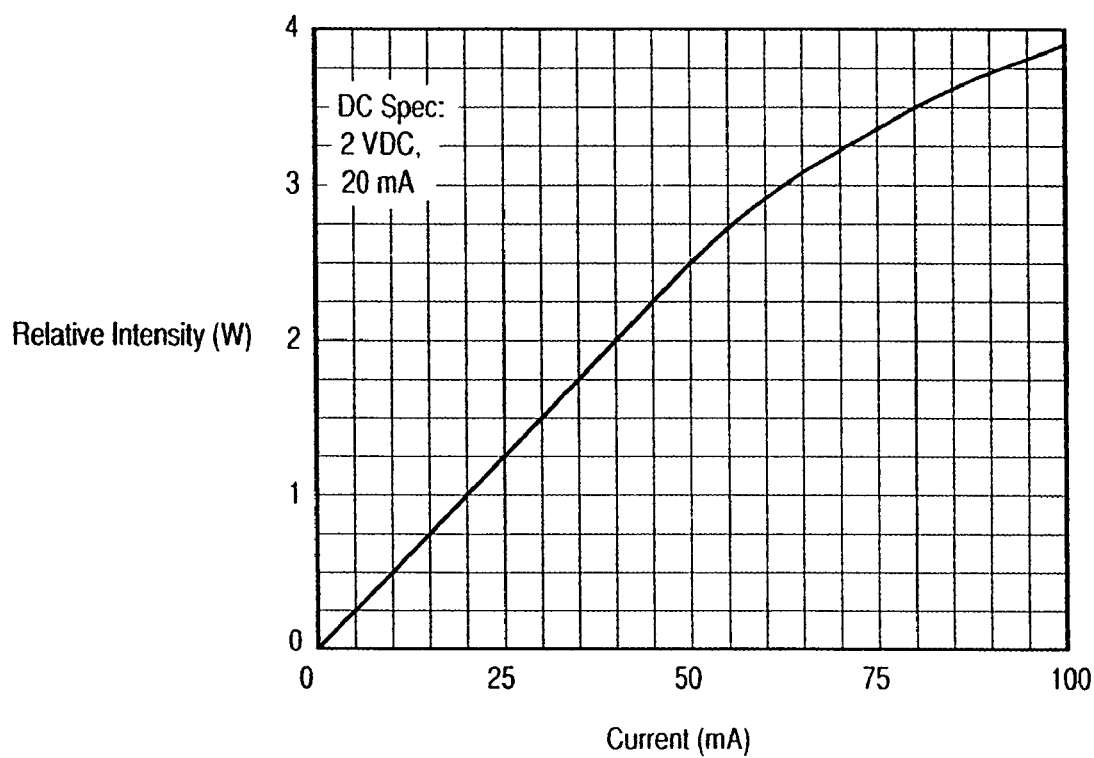
FIG. 12 is a graph showing measured light output power as a function of LED current.

An approximation that LED light output is proportional to LED current is very close for most operating values of LED current, but the approximation usually overestimates light output at high current values. A typical curve for AlInGaP LEDs, the common material type for LEDs with a 2 VDC specification, is shown in FIG. 12.

With this measured result, the relative direct AC drive efficiencies computed in equations (8) and (10) are lowered somewhat, but they are still well above unity. A numerical integration using FIG. 12 indicates that equations (8) and (10) overestimate efficiency of the direct AC design in the example presented by about 15%, and closer estimates for the above relative efficiencies are $\epsilon_D \approx 1.53$ and $\epsilon_E \approx 1.06$.

Diminishing light output power at high LED current places the optimal value for RMS and peak LED current values, $I_{avg}$ and $I_{max}$, at a slightly lower value than the average and peak current constraints in equations (5) and (6) allow. For example, FIG. 11 shows that the largest value allowed by equations (5) and (6) for $V_{avg}$ is 1.65 VAC, rather than the value of 1.60 VAC used above. This larger value of $V_{avg} = 1.65$ VAC, achieved by N=72 LEDs in a 120 VAC series block, is slightly less efficient, as well as slightly less reliable, than the value of $V_{avg} = 1.60$ VAC and N=75 LEDs. However, the value of N=72 LEDs in the series block would cost less to produce per unit. Using 110 VAC instead of 120 VAC to obtain a lower number N=69 LEDs in the series block yields yet slightly lower efficiency and reliability still. For decorative LED light strings, this final direct AC drive tradeoff between, say, 70 versus 75 LEDs in the series block exemplified is a matter of practical judgment to provide the highest quality product at the lowest unit cost.

Although it has been shown above that LED specified DC values cannot be directly used in for direct AC drive, these values do have some theoretical utility for using a smaller measurement set to estimate the AC design values. The theoretical basis of this estimation procedure results from applying statistical inference on the LED specifications, using these specifications in a different way than they are obtained or intended.

LEDs are specified by two voltage parameters, a typical, or "nominal" voltage, $V_{nom}$, and a largest, or "supremum" (usually called "maximum" by LED manufacturers) voltage, $V_{sup}$. These specifications are obtained as ensemble estimates, for a large ensemble of alike LEDs, of "typical" and "largest" DC voltages to expect, from variations due to manufacturing, that produce the chosen nominal value of DC current, $I_{nom}$. The nominal DC voltage, $V_{nom}$, is intended as a "typical" value for the LED, obtained either by averaging measurements or by taking the most likely, or modal, value in a measurement histogram. The maximal DC voltage, $V_{sup}$, is intended as a largest, or "supremum," value for the LED, obtained by sorting the largest voltage value measured that produces the chosen nominal value of DC current, $I_{nom}$.

The theoretical problem of interest is to obtain values for average AC voltage, $V_{avg}$, and maximum AC voltage, $V_{max}$, that produce average AC current, $I_{avg}$ and maximum AC current, $I_{max}$, respectively. These voltage values $V_{avg}$ and $V_{max}$ do not consider LED ensemble variations due to manufacturing but instead rely on a large enough number N of LEDs in each AC series block for manufacturing variations to be averaged over. Otherwise, voltage equations (1) and (3) above must be altered slightly to account for expected LED manufacturing variations. Such an alteration would rely on a statistical model obtained by measuring variations of the characteristic AC current versus AC voltage curve, from LED to LED in a large ensemble of alike LEDs. In any event, the voltages $V_{avg}$ and $V_{max}$ are fundamentally defined to represent characteristic estimates of voltage for varying values of LED current, obtained by averaging over the ensemble, rather than ensemble estimates, using individual LEDs within the ensemble, of voltages that produce a fixed, say, nominal, value of LED current.

In order to make theoretical inferences from LED specifications, it must be assumed that the specified ensemble random variables representing "nominal" and "supremum" voltages can be interchanged with equivalent characteristic random variables representing corresponding voltages that produce corresponding LED current over time. This assumption is similar to a commonly assumed form of ergodicity in random process theory that interchanges ensemble random variables with corresponding time-series random variables.

With this ergodicity assumption, the AC average and maximum voltage values of interest, $V_{avg}$ and $V_{max}$, can be inferred from the specified diode values for DC nominal and maximum voltage, $V_{nom}$ and $V_{sup}$, respectively, using appropriate DC-to-AC scaling between them. It is desired to obtain a single scale factor $\alpha$ for all LED materials, colors, and LED manufacturers. In trying to find this single value for scale factor $\alpha$, difficulty arises in that the specified voltages, $V_{nom}$ and $V_{sup}$, are fundamentally different for different LED dopant materials. However, given a specific LED dopant material "M", such as AlInGaP or GaAlAs, the variations in $V_{nom}$ and $V_{sup}$ across applicable colors and manufacturers are small enough to be considered fairly insignificant.

Recall that $V_{max}$ is equated with peak input voltage $V_{peak}$ in equation (1), and $V_{avg}$ is equated with RMS input voltage $V_{rms}$ in equation (3). For AC power, the quotient $V_{peak}/V_{rms} = \sqrt{2}$. It would thus be desirable if the quotient $V_{sup}/V_{nom}$ were also always a constant, preferably equal to $\sqrt{2}$, so that a single scale factor $\alpha_M$ could be used for each LED material, "M." Unfortunately, this ratio also varies significantly for different LED materials. As a result, two distinct scale factors $\alpha_M$ and $\beta_M$ are required for each LED material composition, "M." With these material-dependent scale factors, $\alpha_M$ and $\beta_M$, the AC voltages of interests are estimated from DC specified values using, $$V_{avg} \approx \alpha_M V_{nom}, V_{max} \approx \beta_M V_{sup}. \quad (11)$$

where the scale factors $\alpha_M$ and $\beta_M$ are determined by measurement. The advantage provided by this theoretical estimation procedure is that the set of measurements determining characteristic curves for peak and average AC current versus AC voltage need only be obtained for each LED dopant material, independent of LED color and LED manufacturer. Of course, the disadvantage to this procedure is that it is approximate when compared to making full measurement sets for all specific types of LEDs considered, and hence some experimentation with the exact number of LEDs is required.

For AlInGaP LEDs, $V_{nom}=2.0$ VDC and $V_{sup}=2.4$ VDC represent the centroids of specified values across applicable colors and from various manufacturers. The characteristic curves presented in FIG. 7 were obtained from AlInGaP LEDs. From FIG. 11, and the criteria for average and maximum AC current defined in equations (5) and (6), respectively, AC current values $I_{avg}=36$ mA and $I_{max}=95$ mA were chosen previously, with $V_{max}=\sqrt{2} V_{avg}$ and $V_{avg}=1.6$ VAC. Equations (11), then, lead to $\alpha_{AlInGaP}=0.80$ and $\beta AlInGaP=0.94$. These values may be used theoretically in equations (11) to estimate approximate AC average and maximum voltages, $V_{avg}$ and $V_{max}$, for other AlInGaP LEDs.

FIG. 13 shows measured characteristic curves for a different set of alike LEDs, where the dopant material is GaAlAs, rather than AlInGaP. For GaAlAs LEDs, $V_{nom}=1.7$ VDC and $V_{sup}=2.2$ VDC represent the centroids of specified values across applicable colors and from various manufacturers. From FIG. 13, and the criteria for average and maximum AC current defined in equations (5) and (6), respectively, AC current values $I_{avg}=38$ mA and $I_{max}=95$ mA are chosen, with again $V_{max}=\sqrt{2} V_{avg}$, but now $V_{avg}=1.45$ VAC. Equations (11), then, lead to $\alpha_{GaAlAs}=0.85$ and $\beta GaAlAs=0.93$. These values may be used theoretically in equations (11) to estimate approximate AC average and maximum voltages, $V_{avg}$ and $V_{max}$, for other GaAlAs LEDs. Note that, with 120 VAC assumed for the RMS input voltage, this value $V_{avg}=1.45$ VAC leads to N=83 LEDs per series block. Similarly, with 110 VAC assumed for the RMS input voltage, N=76 LEDs per series block. Rounding these values leads to either 75, 80, or 85 LEDs per series block in a manufactured product, with N=75 being most desirable for a decorative LED light string from a cost basis, if it is sufficiently reliable.

The above direct AC drive design procedure has been verified by building numerous decorative LED light string prototypes using a variety of dopant materials, colors, and manufacturers. Many of these prototypes were built as long as two years ago, and all prototypes have remained operating continuously without any sign of impending failure. Moreover, a number of these prototypes were subjected to harsh voltage surge and voltage spike conditions. Voltage surge conditions were produced using high power appliances in the same circuit, all of which failed to produce anything other than at most some flickering. In about half of these experiments the voltage surges created caused circuit breakers to trip.

Voltage spikes, simulating lightning discharges, were produced by injecting 1000 V, 10 A pulses of up to 10 ms duration and one second apart into a 100 A main circuit of a small home using a pulse generator and 10 kW power amplifier. The amplifier was powered from the main electrical input of an adjacent home. During these tests, all decorative LED light string prototypes merely flickered in periodic succession at one second intervals. In the meantime during these tests, the protective circuitry of adjoining electronic equipment shut off without any ensuing damage. All these tests verified conclusively that the decorative LED light strings were designed to be highly reliable by the direct AC drive method, without the use of any current-limit circuitry.

It is to be understood, however, that current-limit circuitry may be omitted in accordance with embodiments of the invention, omission of the current-limit circuitry is not required. Instead, current-limit circuitry, such as a resistor, may be included in the circuit as an independent element or as part of an LED. For example, one or more LED in a series of LEDs may be equipped with a known drop-down resistor integrally formed as part of the LED.

It will be understood that various changes in the details, materials and arrangements of the parts which have been described and illustrated in order to explain the nature of this invention may be made by those skilled in the art without departing from the principle and scope of the invention as expressed in the following claims.

This application incorporates the following disclosures by reference: U.S. Pat. Nos. 6,461,019, 6,072,280; 6,830,358; application Ser. No. 09/378,631 filed Aug. 20, 1999 titled Preferred Embodiment to Led Light String, now abandoned; and application Ser. No. 09/339,616 filed Jun. 24, 1999, titled Preferred Embodiment to Led Light String; U.S. application Ser. No. 10/657,256; U.S. application Ser. No. 10/755,463 filed Jan. 13, 2004; and U.S. provisional application No. 60/119,804, filed Feb. 12, 1999.

The foregoing detailed description of the preferred embodiments of the invention has been provided for the purpose of explaining the principles of the invention and its practical application, thereby enabling others skilled in the art to understand the invention for various embodiments and with various modifications as are suited to the particular use contemplated. This description is not intended to be exhaustive or to limit the invention to the precise embodiments disclosed. Modifications and equivalents will be apparent to practitioners skilled in this art and are encompassed within the spirit and scope of the appended claims.

What is claimed is:

1. A jacketed light emitting diode assembly, comprising:
   a light emitting diode comprising
      a contact set comprising a positive contact and a negative contact, each of the contacts having a first end portion and a second end portion; and
      a lens body containing a semiconductor chip and the first end portions of the positive and negative contacts;
   an electrical wire set comprising a first electrical wire and a second electrical wire electrically connected to the second end portions of the positive contact and the negative contact, respectively; and
   an integrally molded thermoplastic jacket directly molded onto the contact set of the light emitting diode.

2. The jacketed light emitting diode assembly according to claim 1, wherein the integrally molded thermoplastic jacket seals the contact set against moisture and airborne contaminants.

3. The jacketed light emitting diode assembly according to claim 1, further comprising a contact separator for isolating the positive and negative contacts from one another.

4. The jacketed light emitting diode assembly according to claim 1, further comprising a light transmissive cover having a cavity with an opening, the cavity receiving the lens body, the opening having at least one of the contact set and the electrical wire set passing therethrough.

5. The jacketed light emitting diode assembly according to claim 4, wherein the thermoplastic jacket enters into the opening of the light transmissive cover.

6. A light string comprising a plurality of light emitting diode assemblies connected to one another, the light emitting diode assemblies each comprising the jacketed light emitting diode assembly of claim 1.

7. A jacketed light emitting diode assembly, comprising:
   a light emitting diode comprising
      a contact set comprising a positive contact and a negative contact, each of the contacts having a first end portion and a second end portion; and
      a lens body containing a semiconductor chip and the first end portions of the positive and negative contacts;
   an electrical wire set comprising a first electrical wire and a second electrical wire electrically connected to the second end portions of the positive contact and the negative contact, respectively; and
   an integrally molded thermoplastic jacket directly molded onto the lens body of the light emitting diode.

8. The jacketed light emitting diode assembly according to claim 7, wherein the integrally molded thermoplastic jacket seals the lens body against moisture and airborne contaminants.

9. The jacketed light emitting diode assembly according to claim 7, further comprising a light transmissive cover having a cavity with an opening, the cavity receiving the lens body, the opening having at least one of the contact set and the electrical wire set passing therethrough.

10. The jacketed light emitting diode assembly according to claim 9, wherein the thermoplastic jacket enters into the opening of the light transmissive cover.

11. The jacketed light emitting diode assembly according to claim 7, wherein the integrally molded thermoplastic jacket is also directly molded onto the contact set of the light emitting diode.

12. A light string comprising a plurality of light emitting diode assemblies connected to one another, the light emitting diode assemblies each comprising the jacketed light emitting diode assembly of claim 7.

13. A jacketed light emitting diode assembly, comprising:
   a light emitting diode comprising
      a contact set comprising a positive contact and a negative contact, each of the contacts having a first end portion and a second end portion; and
      a lens body containing a semiconductor chip and the first end portions of the positive and negative contacts;
   an electrical wire set comprising a first electrical wire and a second electrical wire electrically connected to the second end portions of the positive contact and the negative contact, respectively; and
   an integrally molded thermoplastic jacket directly molded onto the at least a portion of the electrical wire set.

14. The jacketed light emitting diode assembly according to claim 13, wherein the integrally molded thermoplastic jacket seals the electrical wire set against moisture and airborne contaminants.

15. The jacketed light emitting diode assembly according to claim 13, further comprising a contact separator for isolating the electrical wires from one another.

16. The jacketed light emitting diode assembly according to claim 13, further comprising a light transmissive cover having a cavity with an opening, the cavity receiving the lens body, the opening having at least one of the contact set and the electrical wire set passing therethrough.

17. The jacketed light emitting diode assembly according to claim 16, wherein the thermoplastic jacket enters into the opening of the light transmissive cover.

18. The jacketed light emitting diode assembly according to claim 13, wherein the integrally molded thermoplastic jacket is also directly molded onto the contact set of the light emitting diode.

19. The jacketed light emitting diode assembly according to claim 13, wherein the integrally molded thermoplastic jacket is also directly molded onto the lens body of the light emitting diode.

20. The jacketed light emitting diode assembly according to claim 13, wherein the integrally molded thermoplastic jacket is also directly molded onto the contact set and the lens body of the light emitting diode.

21. A light string comprising a plurality of light emitting diode assemblies connected to one another, the light emitting diode assemblies each comprising the jacketed light emitting diode assembly of claim 13.

* * * * *